United States Patent
Choi et al.

(10) Patent No.: US 10,141,382 B2
(45) Date of Patent: Nov. 27, 2018

(54) METHOD OF MANUFACTURING ORGANIC LIGHT EMITTING DIODE DISPLAY PANEL HAVING POLYMER NETWORK LIQUID CRYSTAL

(71) Applicant: Samsung Display Co., Ltd., Yongin-si (KR)

(72) Inventors: Jinwoo Choi, Seoul (KR); Jongsung Bae, Hwaseong-si (KR); Jaeik Lim, Hwaseong-si (KR); WonSang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 15/499,754

(22) Filed: Apr. 27, 2017

(65) Prior Publication Data

US 2017/0237041 A1    Aug. 17, 2017

Related U.S. Application Data

(62) Division of application No. 14/447,160, filed on Jul. 30, 2014, now Pat. No. 9,666,649.

(30) Foreign Application Priority Data

Jan. 6, 2014  (KR) ......................... 10-2014-0001310

(51) Int. Cl.
| | |
|---|---|
| *H01J 1/62* | (2006.01) |
| *H01L 27/32* | (2006.01) |
| *G02F 1/1335* | (2006.01) |
| *G02B 5/02* | (2006.01) |

(Continued)

(52) U.S. Cl.
CPC ........ *H01L 27/3232* (2013.01); *G02B 5/0236* (2013.01); *G02B 5/0278* (2013.01);
(Continued)

(58) Field of Classification Search
CPC ............... H01L 51/5275; H01L 27/322; H01L 51/5284; H01L 51/5268; H01L 51/56;
(Continued)

(56) References Cited

U.S. PATENT DOCUMENTS

| | | |
|---|---|---|
| 2006/0187384 A1 | 8/2006 | Hisatake |
| 2011/0227048 A1 | 9/2011 | Newsome |

(Continued)

FOREIGN PATENT DOCUMENTS

| | | |
|---|---|---|
| CN | 1871627 | 11/2006 |
| CN | 102165621 | 8/2011 |

(Continued)

OTHER PUBLICATIONS

Jie Sun et al., "Reconfigurable fabrication of scattering-free polymer network liquid crystal prism/grating/lens", Applied Physics Letters 102, 161106, Apr. 23, 2013, 4 pages.

(Continued)

*Primary Examiner* — Joseph L Williams
(74) *Attorney, Agent, or Firm* — H.C. Park & Associates, PLC

(57) ABSTRACT

A method of manufacturing an organic light emitting diode display panel, including forming a lower substrate, the lower substrate including a first area and a second area; forming an organic light emitting device on the lower substrate; disposing a polymer network liquid crystal on the organic light emitting device; forming a second optical layer in the second area, the second optical layer including the polymer network liquid crystal; and varying an optical property of the polymer network liquid crystal so as to form a first optical layer in the first area. The optical property of the polymer network liquid crystal in the first optical layer differs from the optical property of the polymer network liquid crystal in the second optical layer.

11 Claims, 22 Drawing Sheets

(51) Int. Cl.
    *G02F 1/1334*      (2006.01)
    *H01L 51/52*      (2006.01)
    *G02B 5/30*      (2006.01)
    *G02F 1/1337*      (2006.01)
    *H01L 51/56*      (2006.01)

(52) U.S. Cl.
    CPC ......... *G02B 5/3016* (2013.01); *G02F 1/1334* (2013.01); *G02F 1/13378* (2013.01); *G02F 1/133512* (2013.01); *G02F 1/133603* (2013.01); *G02F 1/133788* (2013.01); *H01L 27/322* (2013.01); *H01L 27/326* (2013.01); *H01L 51/5268* (2013.01); *H01L 51/5275* (2013.01); *H01L 51/5284* (2013.01); *H01L 51/56* (2013.01); *G02F 2001/13345* (2013.01); *G02F 2201/44* (2013.01); *H01L 27/3244* (2013.01); *H01L 2251/5315* (2013.01)

(58) Field of Classification Search
    CPC ............. G02F 1/133788; G02F 1/1334; G02F 1/13378
    See application file for complete search history.

(56) References Cited

U.S. PATENT DOCUMENTS

2012/0175648 A1    7/2012    Kasano et al.
2013/0229107 A1    9/2013    Park

FOREIGN PATENT DOCUMENTS

| | | |
|---|---|---|
| CN | 102550126 | 7/2012 |
| EP | 1677274 | 7/2006 |
| GB | 2462313 | 2/2010 |
| KR | 1020040062401 | 7/2004 |
| KR | 100998695 | 12/2010 |
| KR | 101280795 | 7/2013 |
| WO | 2012150703 | 11/2012 |

OTHER PUBLICATIONS

Non-Final Office Action dated Sep. 14, 2016, in U.S. Appl. No. 14/447,160.

Notice of Allowance dated Feb. 7, 2017, in U.S. Appl. No. 14/447,160.

METHOD OF MANUFACTURING ORGANIC LIGHT EMITTING DIODE DISPLAY PANEL HAVING POLYMER NETWORK LIQUID CRYSTAL

CROSS-REFERENCE TO RELATED APPLICATION

This application is a Divisional of U.S. application Ser. No. 14/447,160, filed on Jul. 30, 2014, and claims priority from and the benefit of Korean Patent Application No. 10-2014-0001310, filed on Jan. 6, 2014, which is hereby incorporated by reference for all purposes as if fully set forth herein.

BACKGROUND

Field

Exemplary embodiments of the present invention relate to an organic light emitting diode display panel, and a method of manufacturing the same.

Discussion of the Background

In general, an organic light emitting diode display panel includes a display panel including pixels, and a driver to control the display panel. Each pixel includes an organic light emitting device. The organic light emitting device includes an organic light emitting layer to emit light, and electrodes to apply driving voltages to the organic light emitting layer.

The above information disclosed in this Background section is only for enhancement of understanding of the background of the invention and, therefore, it may contain information that does not constitute prior art.

SUMMARY

Exemplary embodiments of the present invention provide an organic light emitting diode display panel having improved light transmission efficiency.

Exemplary embodiments of the present invention also provide a method of manufacturing the organic light emitting diode display panel.

Additional features of the invention will be set forth in the description which follows, and in part will become apparent from the description, or may be learned from practice of the invention.

An exemplary embodiment of the present invention discloses an organic light emitting diode display panel including an upper substrate, an organic light emitting device facing the upper substrate and emitting light to the upper substrate, and a light extraction layer disposed between the upper substrate and the organic light emitting device. The light extraction layer includes first and second optical layers, each having a polymer network liquid crystal and each having different optical properties, and the light extraction layer exits the light to the outside of the upper substrate. The optical property of the polymer network liquid crystal in the first optical layer is different from the optical property of the polymer network liquid crystal in the second optical layer.

An exemplary embodiment of the present invention also discloses a method of manufacturing an organic light emitting diode display panel, including forming a lower substrate including a first area and a second area, forming an organic light emitting device on the lower substrate, providing a polymer network liquid crystal on the organic light emitting device, forming a second optical layer including the polymer network liquid crystal in the second area, and processing the polymer network liquid crystal such that an optical property of the polymer network liquid crystal is varied to form a first optical layer in the first area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
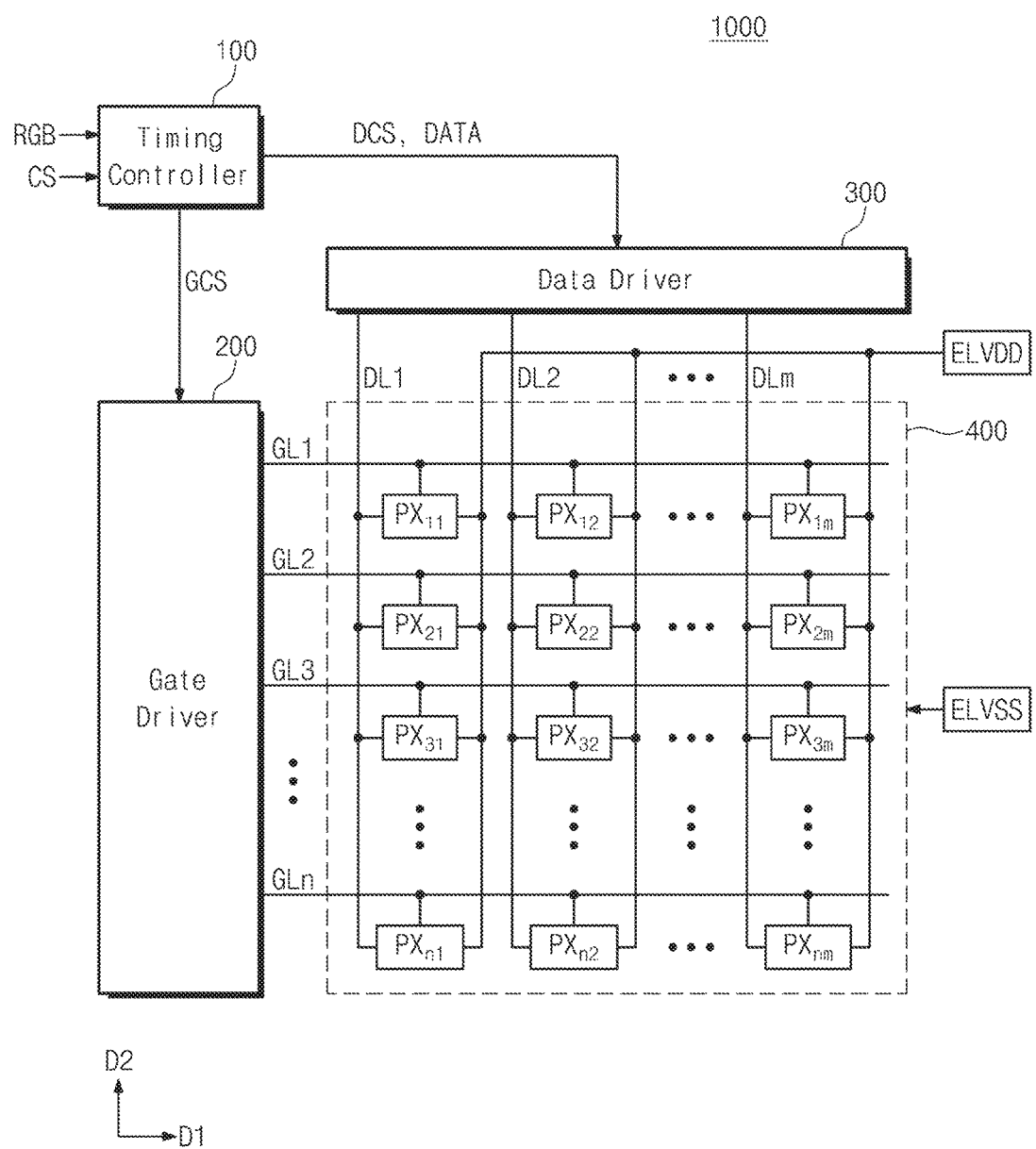
FIG. 1 is a block diagram illustrating an organic light emitting diode display device according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity.

It will be understood that when an element or layer is referred to as being "on", "connected to", or "coupled to" another element or layer, it can be directly on, connected, or coupled to the other element or layer, or intervening elements or layers may be present. In contrast, when an element is referred to as being "directly on," "directly connected to", or "directly coupled to" another element or layer, there are no intervening elements or layers present. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Referring to FIG. 1, the organic light emitting diode display device 1000 includes a display panel 400 to display an image, a gate driver 200 and a data driver 300 to drive the display panel 400, and a timing controller 100 to control the gate driver 200 and the data driver 300.

The timing controller 100 receives image signals RGB and control signals CS from the outside of the organic light emitting diode display device 1000. The timing controller 100 converts a data format of the image signals RGB into a data format appropriate to an interface between the data driver 300 and the timing controller 100 to generate image data DATA, and transmits the image data DATA to the data driver 300. In addition, the timing controller 100 generates a data control signal DCS, e.g., an output start signal, a horizontal start signal, etc., and a gate control signal GCS, e.g., a vertical start signal, a vertical clock signal, a vertical clock bar signal, etc., on the basis of the control signals CS. The data control signal DCS is transmitted to the data driver 300 and the gate control signal GCS is transmitted to the gate driver 200.

The gate driver 200 sequentially outputs gate signals in response to the gate control signal GCS provided from the timing controller 100.

The data driver 300 converts the image data DATA into data voltages in response to the data control signal DCS provided from the timing controller 100, and applies the image data DATA to the display panel 400.

The display panel 400 includes gate lines GL1 to GLn, data lines DL1 to DLm, and pixels PX11 to PXnm. The pixels PX11 to PXnm are each connected to a corresponding gate line of the gate lines GL1 to GLn and a corresponding data line of the data lines DL1 to DLm.

The gate lines GL1 to GLn extend in a first direction D1 and are arranged in a second direction D2 crossing the first direction D1. The data lines DL1 to DLm are insulated from the gate lines GL1 to GLn while crossing the gate lines GL1 to GLn. The data lines DL1 to DLm extend in the second direction D2, and are arranged in the first direction D1.

The display panel 400 receives a first source voltage ELVDD and a second source voltage ELVSS. Each of the pixels PX11 to PXnm is turned on in response to a corresponding one of the gate signals. Each of the pixels PX11 to PXnm receives the first source voltage ELVDD and the second source voltage ELVSS, and generates a light in response to a corresponding one of the data signals. The first source voltage ELVDD is higher than the second source voltage ELVSS.

Each of the pixels PX11 to PXnm includes at least one transistor, at least one capacitor, and an organic light emitting device.

Figure 2:
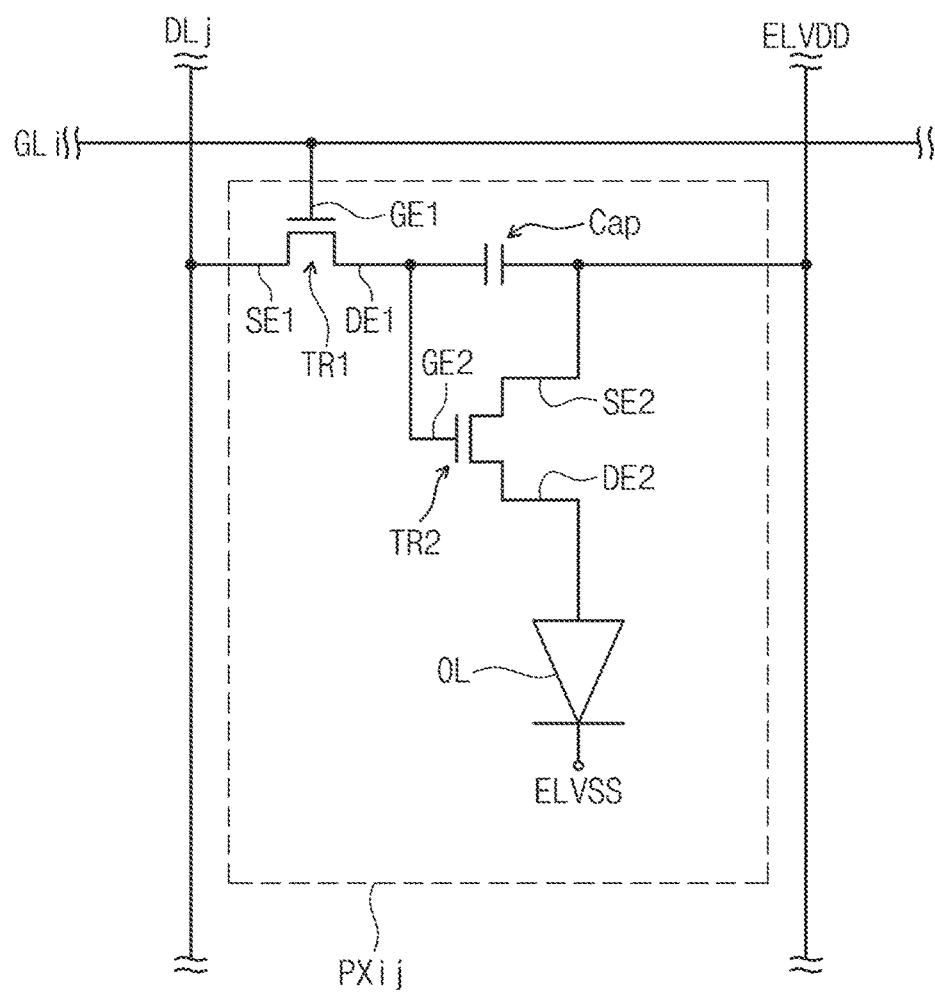
FIG. 2 is an equivalent circuit diagram of a pixel shown in FIG. 1.

FIG. 2 is an equivalent circuit diagram of a pixel PXij connected to an i-th gate line GLi of the gate lines GL1 to GLn, and a j-th data line DLj of the data lines DL1 to DLm. The pixel PXij includes a first transistor TR1, a second transistor TR2, a capacitor Cap, and an organic light emitting device OL. The first transistor TR1 includes a first gate electrode GE1 connected to the i-th gate line GLi, a first source electrode SE1 connected to the j-th data line DLj, and a first drain electrode DE1. The first transistor TR1 outputs the data signal applied to the j-th data line DLj in response to the gate signal applied to the i-th gate line.

The capacitor Cap includes a first electrode connected to the first transistor TR1 and a second electrode that is supplied with the first source voltage ELVDD. The capacitor Cap is charged with electric charges corresponding to a difference between the voltage corresponding to the data signal from the first transistor TR1 and the first source voltage ELVDD.

The second transistor TR2 includes a second gate electrode GE2 connected to the first drain electrode DE1 of the first transistor TR1 and the first electrode of the capacitor Cap, a source electrode SE2 that is supplied with the first source voltage ELVDD, and a second drain electrode DE2. The second drain electrode DE2 is connected to the organic light emitting device OL.

The second transistor TR2 controls a driving current flowing through the organic light emitting device OL in response to an amount of electric charge charged in the capacitor Cap. A turn-on period of the second transistor TR2 is determined by the amount of the electric charge charged in the capacitor Cap. The second transistor TR2 applies a voltage having a level lower than that of the first source voltage ELVDD to the organic light emitting device OL.

The organic light emitting device OL emits light during the turn-on period of the second transistor TR2. The light emitted from the organic light emitting device OL has a color determined depending on the material of the organic light emitting device OL. For instance, the color of the light emitted from the organic light emitting device OL may be red, green, blue, or white.

Figure 3:
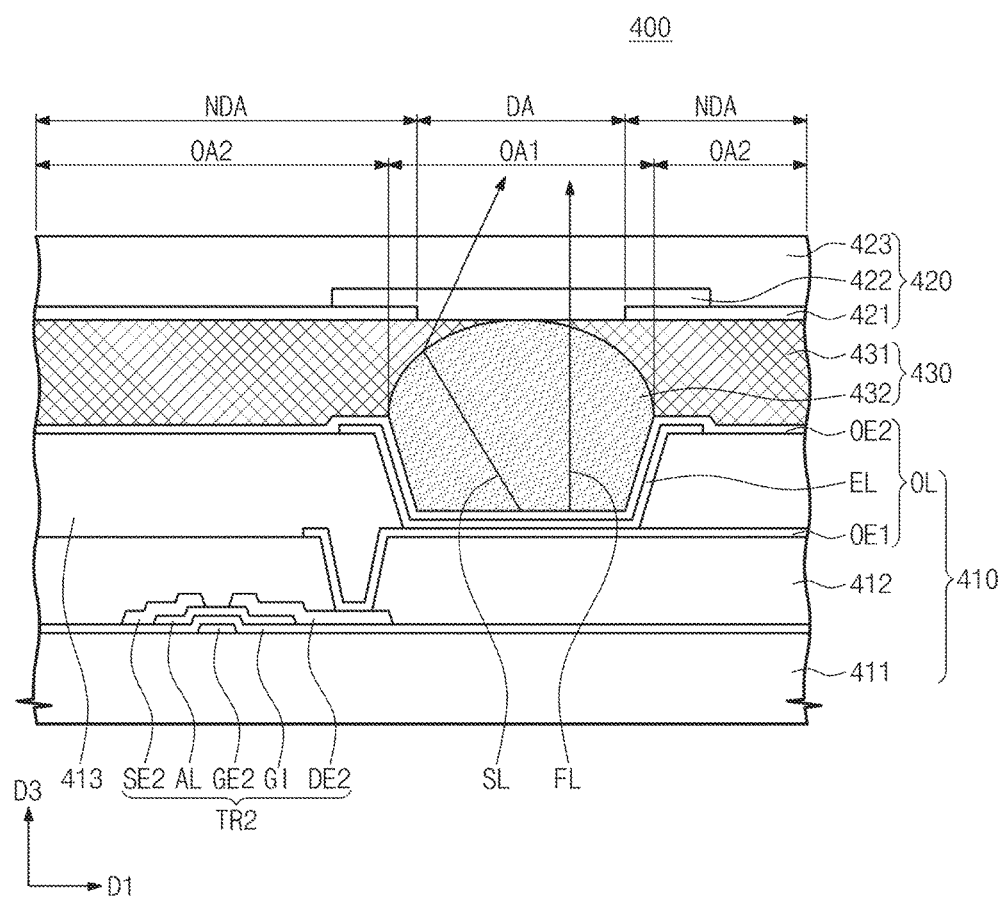
FIG. 3 is a cross-sectional view of a display panel shown in FIG. 1.

FIG. 3 is a cross-section of the pixel PXij and the display panel 400.

The display panel 400 includes a lower substrate 410, an upper substrate 420 facing the lower substrate 410, and a light extraction layer 430. The display panel 400 includes a display area DA and a non-display area NDA. The upper substrate 420 includes an upper base substrate 423, a color filter 422, and a black matrix 421.

The upper base substrate 423 serves as a base for the upper substrate 420 and includes a glass or plastic material having high light transmittance.

The color filter 422 is disposed at a position corresponding to the display area DA. The color filter 422 may be a red, green, or blue color filter.

The black matrix 421 is disposed at a position corresponding to the non-display area NDA, and blocks light traveling thereto. The black matrix 421 includes a light blocking material to block light.

The lower substrate 410 includes a lower base substrate 411, an insulating layer 412, a pixel definition layer 413, the second transistor TR2, and the organic light emitting device OL. The lower base substrate 411 serves as a base for the lower substrate 410, and includes a glass or plastic material having high light transmittance.

The second transistor TR2 is disposed on the lower base substrate 411, and further includes a gate insulating layer GI and a semiconductor layer AL.

The second gate electrode GE2 is disposed on the lower base substrate 411. The semiconductor layer AL is disposed on the second gate electrode GE2, while the gate insulating layer GI is disposed between the semiconductor layer AL and the second gate electrode GE2. The gate insulating layer GI electrically insulates the semiconductor layer AL from the second gate electrode GE2. The second source electrode SE2 makes contact with the semiconductor layer AL, and the second drain electrode DE is spaced apart from the second source electrode SE2 and makes contact with the semiconductor layer AL.

An insulating layer 412 is disposed on the second transistor TR2. The insulating layer 412 includes an inorganic and/or an organic material. A contact hole is formed in the insulating layer 412 to expose a portion of the second drain electrode DE2.

The organic light emitting device OL includes a first electrode OE1, a second electrode OE2, and a light emitting layer EL. The first electrode OE1 is disposed on the insulating layer 412, and is electrically connected to the second drain electrode DE2 through the contact hole.

The pixel definition layer 413 is disposed on the lower base substrate 411 to correspond to the non-display area NDA. The pixel definition layer 413 covers a portion of the first electrode OE1 disposed in the non-display area NDA. An opening is formed in the pixel definition layer 413 to expose at least a portion of the first electrode OE1. The first electrode OE1 receives the first source voltage ELVDD from the second drain electrode DE2.

The light emitting layer EL is disposed on at least a portion of the pixel definition layer 413 and the first electrode OE1. The light emitting layer EL makes contact with the first electrode OE1 through the opening. The light emitting layer EL may be formed of various luminous substances containing a host and a dopant. A fluorescent dopant and a phosphorescent dopant may be used as the dopant. As the host, for example, Alq3C CBP(4,4'-N,N'-dicarbazole-biphenyl) may be used, but it should not be limited thereto or thereby.

The second electrode OE2 is disposed over the light emitting layer EL and the pixel definition layer 413. The second electrode OE2 covers the light emitting layer EL and contacts the light emitting layer EL. The second electrode OE2 receives the second source voltage ELVSS.

An electric field corresponding to a difference in electric potential between the first source voltage ELVDD and the second source voltage ELVSS is formed in the light emitting layer EL. The light emitting layer EL emits light to the upper substrate 420 in response to the electric field.

The light extraction layer 430 is disposed between the upper substrate 420 and the second electrode OE2. The light extraction layer 430 includes a first optical layer 431 and a second optical layer 432, and directs light towards the upper substrate 420 through the first and second optical layers 431 and 432.

Figure 4:
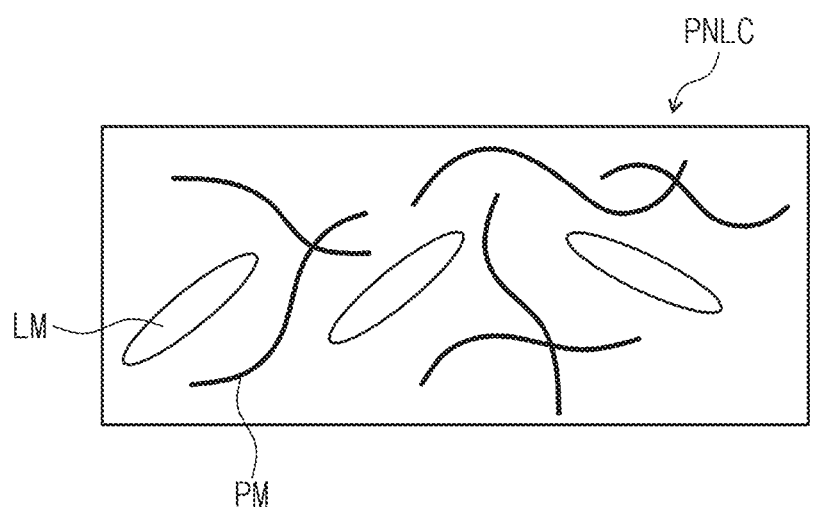
FIG. 4 is a view illustrating a polymer network liquid crystal.
Figure 5:
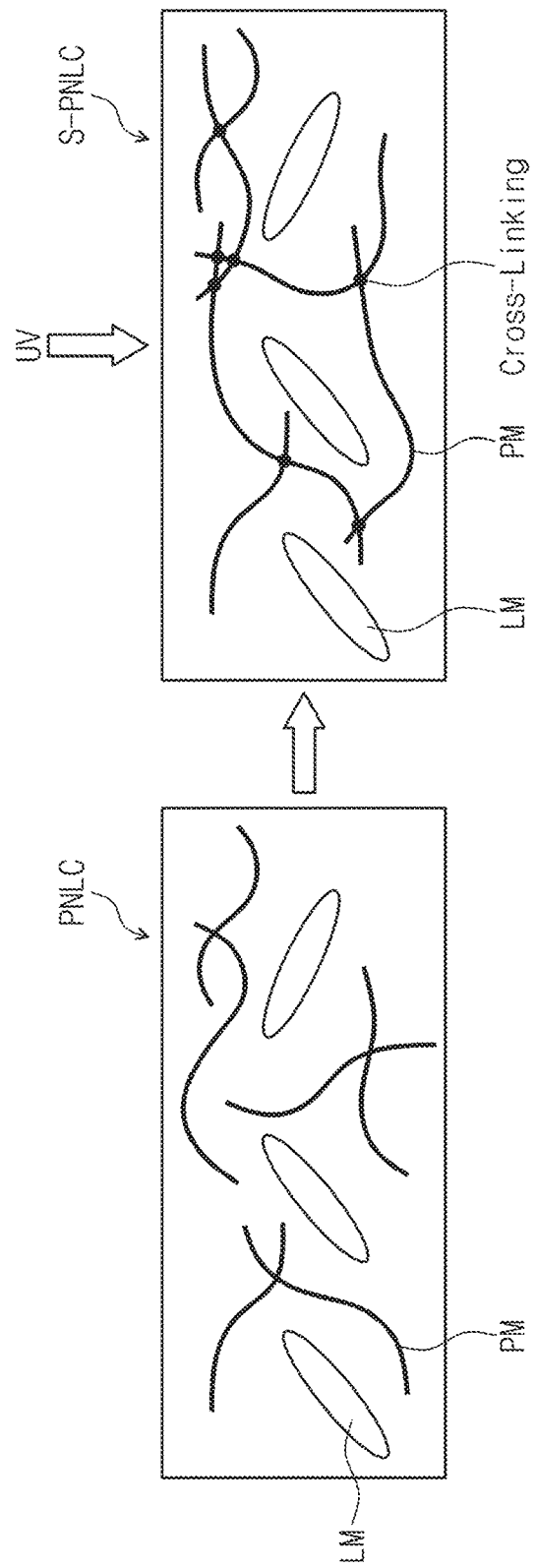
FIG. 5 is a view illustrating a method of manufacturing a sheared polymer network liquid crystal.

The first light optical layer 431 includes a polymer network liquid PNLC (refer to FIG. 4), and the second light optical layer 432 includes a sheared polymer network liquid crystal S-PNLC (refer to FIG. 5).

Hereinafter, the polymer network liquid crystal PNLC and the sheared polymer network liquid crystal S-PNLC will be described in detail with reference to FIGS. 4 and 5.

FIG. 4 is a view showing the polymer network liquid crystal and FIG. 5 is a view showing a method of manufacturing the sheared polymer network liquid crystal.

Referring to FIG. 4, the polymer network liquid crystal PNLC includes polymers PM and liquid crystals LM. The polymers PM are distributed between the liquid crystals LM in a network arrangement.

The sheared polymer network liquid crystal S-PNLC is formed by radiating an ultraviolet ray UV toward the polymer network liquid crystal PNLC and curing the polymers PM. In more detail, each polymer PM cross-links with an adjacent polymer PM thereto in response to the intensity of the ultraviolet ray UV. This is referred to as a "cross-linking" or a "curing" reaction.

The sheared polymer network liquid crystal S-PNLC has a refractive index that is proportional to the degree of cross-linking. For instance, when a refractive index of the polymers PM is large, the refractive index of the sheared polymer network liquid crystal S-PNLC becomes larger as the degree of the cross-linking becomes higher. The refractive index of the sheared polymer network liquid crystal S-PNLC is greater than the refractive index of the polymer network liquid crystal PNLC.

Referring to FIG. 3, the second optical layer 432 has a lens structure, e.g., which may be, but is not limited to, a convex lens structure.

The display panel 400 includes a first area OA1 including the display area DA, and a second area OA2 surrounding the first area OA1. The second optical layer 432 may be disposed on the second electrode OE2 to correspond to the first area OA1, but the location of the second optical layer 432 need not be so limited. That is, the locations of the first area OA1 and the second optical layer 432 may vary with respect to the display area DA and the non-display area NDA. For instance, the first area OA1 may be defined inside the display area DA. Accordingly, the second optical layer 432 may be provided only in the display area DA. In addition, the first area OA1 may be defined to match the display area DA. Therefore, a boundary of the display area DA may match a boundary of the convex lens structure of the second optical layer 432.

The first optical layer 431 is disposed at a position adjacent to and surrounding the second optical layer 432. In more detail, the first optical layer 431 is disposed between the second electrode OE2 and the upper substrate 420 to correspond to the second area OA2. In addition, the first optical layer 431 is disposed between an upper surface of the convex lens structure of the second optical layer 432 and the upper substrate 420 in the first area OA1. Thus, a boundary surface between the first optical layer 431 and the second optical layer 432 has a convex surface toward the upper substrate 420 to correspond to the convex lens structure.

A first refractive index of the first optical layer 431 differs from a second refractive index of the second optical layer 432. The first and second optical layers 431 and 432 include the polymer network liquid crystal PNLC and the sheared polymer network liquid crystal S-PNLC, respectively, and the sheared polymer network liquid crystal S-PNLC has a refractive index greater than that of the polymer network liquid crystal PNLC. Accordingly, the second refractive index is greater than the first refractive index, and the difference is in a range of about 1.4 to about 2.

The light emitted from the organic light emitting device OL travels in various directions. Of all the light emitted from the organic light emitting device OL, a side surface light SL traveling to the black matrix 421 is blocked by the black matrix 421, thereby reducing the light transmission efficiency of the display panel 400. According to the present exemplary embodiment, however, because the second optical layer 432 has the convex lens structure, and the second refractive index is greater than the first refractive index, the light extraction layer 430 changes an optical path of the side surface light SL such that the side surface light SL travels to the upper substrate 420 corresponding to the display area DA and exits to the outside of the upper substrate 420 through the upper substrate 420. In other words, the light extraction layer 430 condenses the light, which travels to the side surface among the light emitted from the organic light emitting device OL, to the display area DA using the convex lens structure, thereby improving the light transmission efficiency of the display panel 400.

In more detail, the side surface light SL is emitted from the organic light emitting device OL and travels toward the black matrix 421 along a direction inclined to the first direction D1. When the side surface light SL reaches the boundary surface between the first and second optical layers 431 and 432, the side surface light SL is refracted by the boundary surface, and thus, the side surface light SL exits to the outside of the upper substrate 420 corresponding to the display area DA through the upper substrate 420.

In addition, the emitted light includes a front surface light FL traveling to the upper substrate 420 corresponding to the display area DA. The side surface light SL has a first set of color coordinates, and the front surface light FL has a second set of color coordinates different from the set of first color coordinates. Accordingly, the color coordinates of the light may vary depending on a viewing angle. However, according to the present exemplary embodiment, the optical path of the side surface light SL is changed by the light extraction layer 430, so that the side surface light SL exits to the outside through the upper substrate 420 corresponding to the display area DA together with the front surface light FL. Therefore, the light obtained by mixing the side surface light SL and the front surface light FL is perceived by a user. Thus, variations of the color coordinates may be reduced regardless of the viewing angle.

Figure 6:
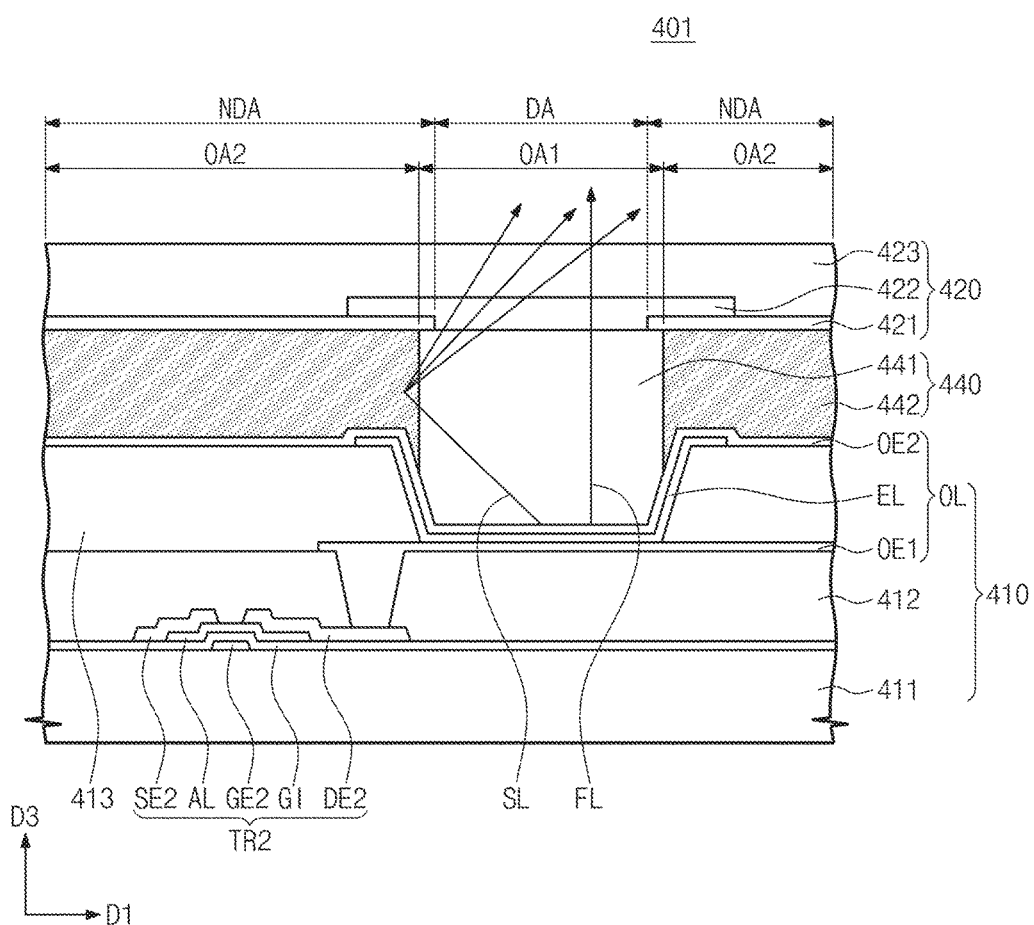
FIG. 6 is a cross-sectional view of a display panel according to another exemplary embodiment of the present invention.

FIG. 6 is a cross-sectional view showing a display panel 401 according to another exemplary embodiment of the present disclosure. In FIG. 6, the same reference numerals denote the same elements in FIGS. 1 to 5, and thus, detailed descriptions of the same elements will be omitted.

Referring to FIG. 6, the display panel 401 includes a light extraction layer 440. The display panel 401 has the same structure and function as those of the display panel 400 shown in FIG. 3 except for the light extraction layer 440.

The light extraction layer 440 is disposed between the upper substrate 420 and the second electrode OE2. The light extraction layer 440 includes a first optical layer 441 and a second optical layer 442, and outputs light emitted from the organic light emitting device OL towards the upper substrate 420 through the first and second optical layers 441 and 442.

The first optical layer 441 includes an aligned polymer network liquid crystal O-PNLC (refer to FIG. 7), and the second optical layer 442 includes the sheared polymer network liquid crystal S-PNLC.

Hereinafter, the aligned polymer network liquid crystal O-PNLC will be described in detail with reference to FIGS. 7 and 8.

Figure 7:
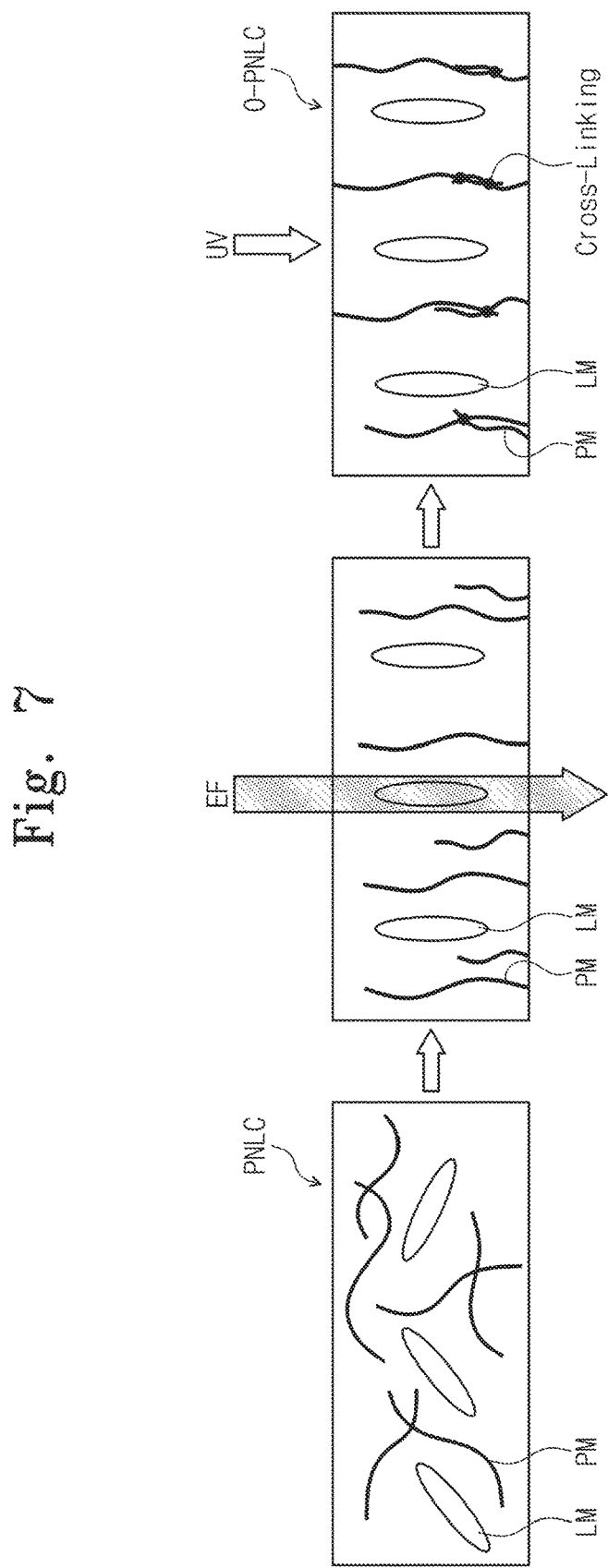
FIG. 7 is a view illustrating a method of manufacturing an aligned polymer network liquid crystal.
Figure 8:
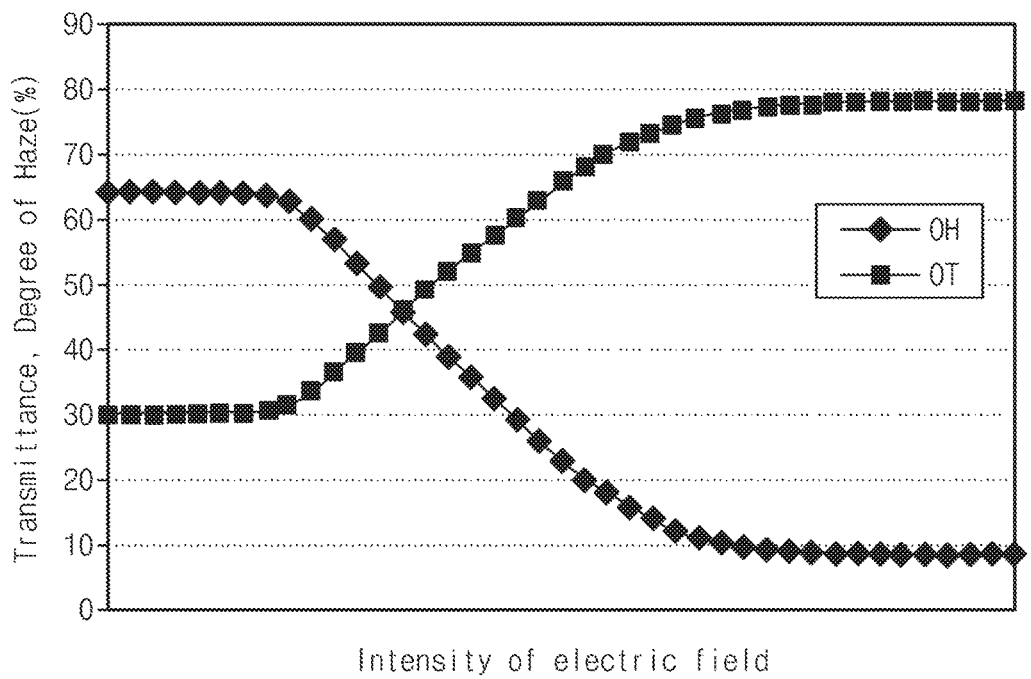
FIG. 8 is a graph illustrating transmittance and haze of the polymer network liquid crystal according to an electric field applied to the polymer network liquid crystal.

FIG. 7 is a view illustrating a method of manufacturing the aligned polymer network liquid crystal, and FIG. 8 is a graph showing transmittance and the degree of haze of the polymer network liquid crystal according to an electric field applied to the polymer network liquid crystal.

The aligned polymer network liquid crystal O-PNLC is formed by applying an electric field EF to the polymer network liquid crystal PNLC to align the polymers PM and the liquid crystals LM, and radiating the ultraviolet ray UV to the polymer network liquid crystal PNLC to cure the polymers PM while the polymers PM and the liquid crystals LM are aligned. In more detail, when the electric field EF is applied in a thickness direction of the polymer network liquid crystal PNLC, the polymers PM and the liquid crystals LC are aligned in the thickness direction in response to the electric field. Then, when the ultraviolet ray UV is radiated to the polymer network liquid crystal PNLC, the polymers PM are cross-linked to each other.

The aligned polymer network liquid crystal O-PNLC has a degree of haze determined according to the intensity of the electric field EF applied to align the polymers PM and the liquid crystals LM. In detail, as shown in FIG. 8, as the intensity of the electric field EF becomes greater, the transmittance of the polymer network liquid crystal O-PNLC becomes larger, and the degree of haze of the aligned polymer network liquid crystal O-PNLC becomes smaller. Therefore, when the intensity of the electric field EF becomes stronger, the transmittance OT of the aligned polymer network liquid crystal O-PNLC is about 80% and the degree of haze OH of the aligned polymer network liquid crystal O-PNLC is about 10%. Thus, the aligned polymer network liquid crystal O-PNLC transmits the light incident thereto without scattering the light.

On the contrary, when the intensity of the electric field EF becomes weaker, the transmittance OT of the aligned polymer network liquid crystal O-PNLC is about 30% and the degree of haze OH of the aligned polymer network liquid crystal O-PNLC is about 65%, and thus the aligned polymer network liquid crystal O-PNLC scatters the light incident thereto.

Referring to FIG. 6, the display panel 401 includes a first area OA1 and a second area OA2 surrounding the first area OA1. The first area OA1 and the second area OA2 are sequentially arranged in the first direction D1.

The first optical layer 441 is disposed between the second electrode OE2 and the upper substrate 420 to correspond to the first area OA1, and the second optical layer 442 is disposed between the second electrode OE2 and the upper substrate 420 to correspond to the second area OA2. Accordingly, a boundary surface between the first and second areas OA1 and OA2 is formed along the third direction D3.

The arrangement of the first area OA1 and the first optical layer 441 corresponding to the first area OA1 may vary with respect to the display area DA and the non-display area NDA. For instance, the first area OA1 may be defined inside the display area DA. Accordingly, the first optical layer 441 may be provided only in the display area DA.

In addition, the first area OA1 may be defined to match the display area DA. Therefore, a boundary of the display area DA may match the boundary of the convex lens structure of the second optical layer 442.

The first optical layer 441 has a first degree of haze and the second optical layer 442 has a second degree of haze different from the first degree of haze. Because the first optical layer 441 and the second optical layer 442 respectively include the aligned polymer network liquid crystal O-PNLC and the sheared polymer network liquid crystal S-PNLC, and the aligned polymer network liquid crystal O-PNLC has a smaller degree of haze than that of the sheared polymer network liquid crystal S-PNLC, the first degree of haze is less than the second degree of haze.

In addition, the first optical layer 441 has a first transmittance, and the second optical layer 442 has a second transmittance different from the first transmittance. The first degree of haze is less than the second degree of haze, and therefore, the first transmittance is greater than the second transmittance.

The light emitted from the organic light emitting device OL travels in various directions. In particular, a portion of the side surface light SL emitted inclined to a line normal to the upper surface of the lower base substrate 410 travels to the black matrix 421 and is blocked and absorbed by the black matrix 421. In this case, the light transmission efficiency of the display panel 401 is reduced. However, according to the present exemplary embodiment, the second optical layer 442 has a degree of haze that is greater than that of the first optical layer 441, and is disposed under the black matrix 421. Accordingly, the second optical layer 442 scatters the light before the light is incident to the black matrix 421 to allow the portion of the side surface light SL to exit to the display area DA. Therefore, the amount of the light blocked and absorbed by the black matrix 421 is reduced, and the light transmission efficiency of the display panel 421 is improved.

In addition, the optical path of the side surface light SL having the first set of color coordinates is changed by the second optical layer 442, and the side surface light SL exits to the outside through the upper substrate 420 corresponding to the display area DA together with the front surface light FL having the second set of color coordinates. Thus, the light obtained by mixing the side surface light SL and the front surface light FL, which have different sets of color coordinates, is perceived by the user, and thus, variations of the color coordinates may be reduced regardless of the viewing angle.

Figure 9:
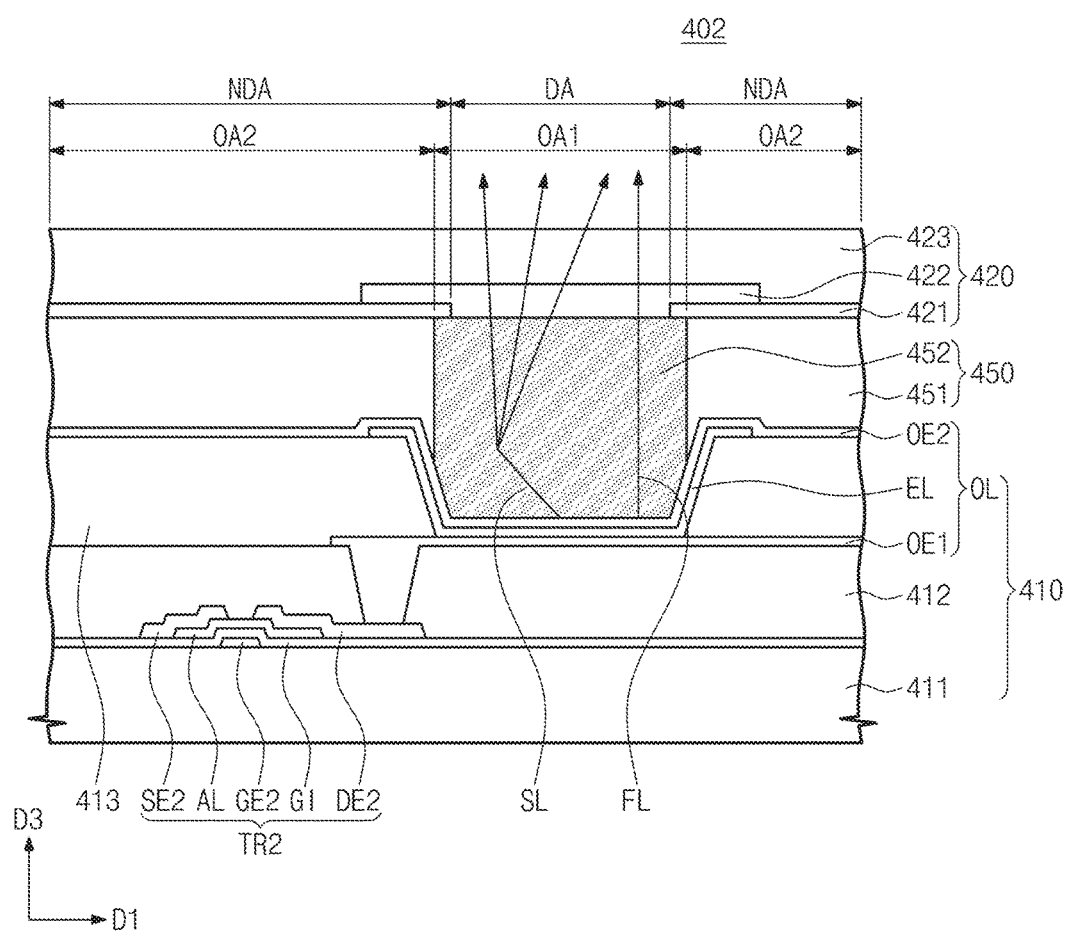
FIG. 9 is a cross-sectional view of a display panel according to another exemplary embodiment of the present invention.

FIG. 9 is a cross-sectional view showing a display panel 402 according to another exemplary embodiment of the present invention. In FIG. 9, the same reference numerals denote the same elements in FIGS. 1 to 8, and thus, detailed descriptions of the same elements will be omitted.

Referring to FIG. 9, the display panel 402 includes a light extraction layer 450. The display panel 402 has the same structure and function as those of the display panel 401, except for the light extraction layer 450.

The light extraction layer 450 includes a first optical layer 451 and a second optical layer 452. The first optical layer 451 is disposed between the second electrode OE2 and the upper substrate 420 to correspond to the second area OA2, and the second optical layer 452 is disposed between the second electrode OE2 and the upper substrate 420 to correspond to the first area OA1.

The light emitted from the organic light emitting device OL travels in various directions. Among the light emitted from the organic light emitting device OL, a side surface light SL traveling to the black matrix 421 is blocked by the black matrix 421, and then absorbed, so that the light transmission efficiency of the display panel 400 is reduced. According to the present exemplary embodiment, because the first optical layer 451 has relatively large degree of haze, the first optical layer 451 scatters the side surface light SL such that the scattered side surface light SL exits to the outside through the upper substrate 420 corresponding to the display area DA. As a result, the light transmission efficiency of the display panel 400 is increased.

The optical path of the side surface light SL having the first set of color coordinates is changed by the first optical layer 451, and the side surface light SL exits to the outside through the upper substrate 420 corresponding to the display area DA together with the front surface light FL having the second set of color coordinates. Accordingly, the light obtained by mixing the side surface light SL and the front surface light FL, which have different sets of color coordinates, is perceived by the user. Thus, variations of the color coordinates may be reduced regardless of the viewing angle.

Figure 10:
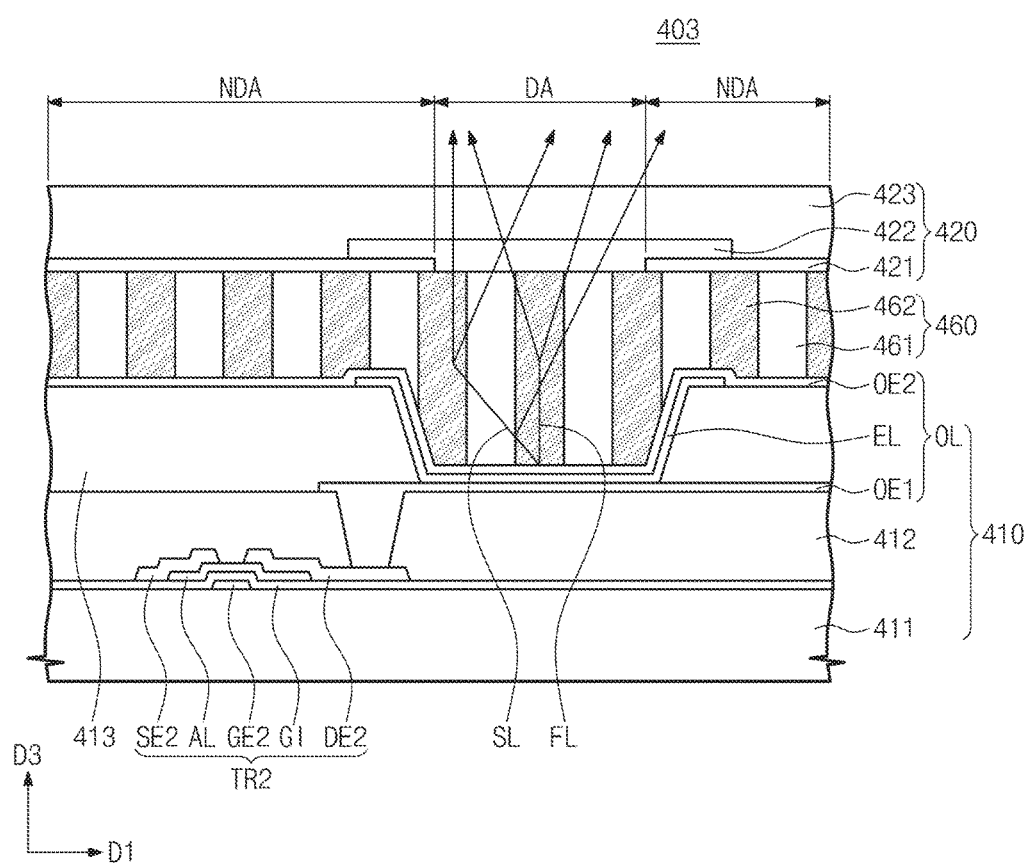
FIG. 10 is a cross-sectional view of a display panel according to another exemplary embodiment of the present invention.

FIG. 10 is a cross-sectional view showing a display panel 403 according to another exemplary embodiment of the present invention. In FIG. 10, the same reference numerals denote the same elements in FIGS. 1 to 7, and thus detailed descriptions of the same elements will be omitted.

Referring to FIG. 10, the display panel 403 includes a light extraction layer 460. The display panel 403 has the same structure and function as those of the display panel 401 shown in FIG. 6, except for the light extraction layer 460.

The light extraction layer 460 includes a first optical layer 461 and a second optical layer 462. The first optical layer 461 and the second optical layer 462 are disposed between the second electrode OE2 and the upper substrate 420.

According to the present exemplary embodiment, the first optical layer 461 and the second optical layer 462 may be arranged in various shapes. For instance, the first optical layer 461 and the second optical layer 462 may be disposed in one of the display area DA and the non-display area NDA, and alternately arranged with each other.

The light emitted from the organic light emitting device OL travels in various directions. Among the light emitted from the organic light emitting device OL, a side surface light SL traveling to the black matrix 421 is blocked and absorbed by the black matrix 421, thereby reducing the light transmission efficiency of the display panel 400. According to the present exemplary embodiment, because the first optical layer 451 has a relatively large degree of haze, the second optical layer 462 scatters the side surface light SL to allow the scattered side surface light SL to exit to the outside through the upper substrate 420 corresponding to the display area DA. As a result, the light transmission efficiency of the display panel 400 is increased. In addition, the first optical layer 461 and the second optical layer 462 are alternately arranged with each other in the display area DA. Thus, the side surface light SL may be effectively extracted by the first optical layer 461 and the second optical layer 462.

According to the simulated result, when the light extraction layer 460 is present, the light transmission efficiency may be increased by about 30% over the case in which the light extraction layer 460 is not present.

In addition, the optical path of the side surface light SL having the first set of color coordinates is changed by the second optical layer 452, and the side surface light SL exits to the outside through the upper substrate 420 corresponding to the display area DA together with the front surface light FL having the second set of color coordinates. Accordingly, the light obtained by mixing the side surface light SL and the front surface light FL, which have different sets of color coordinates, is perceived by the user. Thus, variations of the color coordinates may be reduced regardless of the viewing angle.

In particular, the number of times in which the side surface light SL meets the second optical layer 462 while traveling along the optical path thereof in the display area DA is greater than the number of times at which the front surface light FL meets the second optical layer 462 while traveling along the optical path thereof. Thus, the side surface light SL is scattered to a greater degree than the front surface light FL, Thus, the light transmission efficiency of the display panel 403 is increased, thereby reducing the variations of the color coordinates according to the viewing angle.

Figure 11:
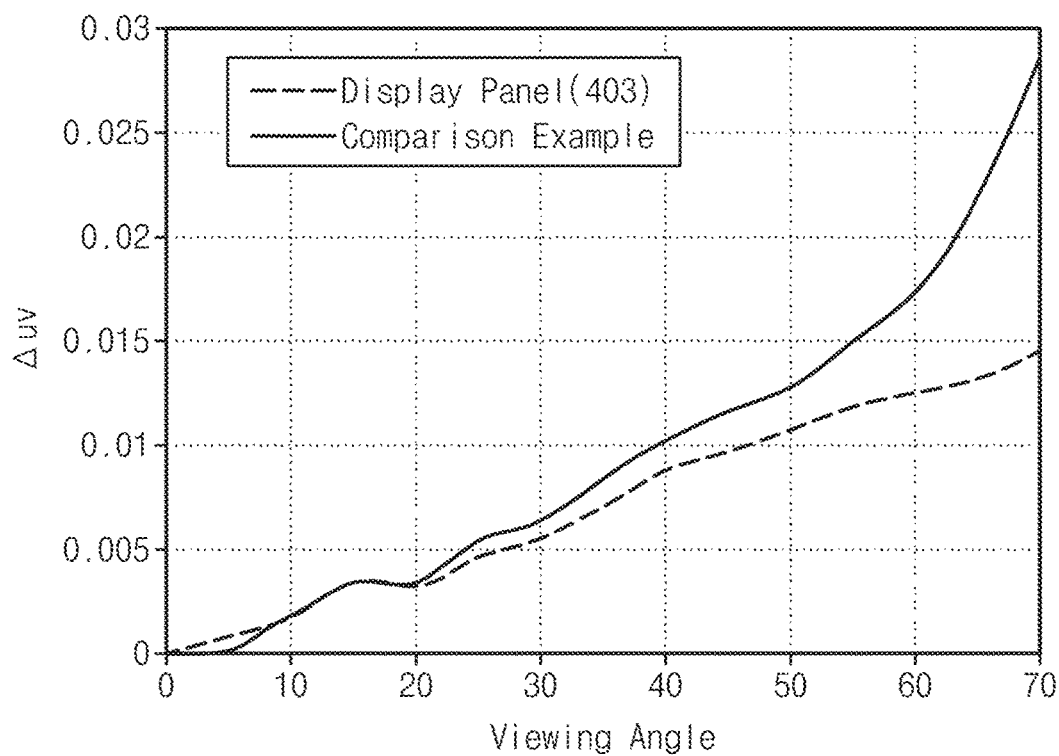
FIG. 11 is a graph illustrating a simulation result of a color coordinate variation as a function of a viewing angle illustrating a comparison example and a display panel according to an exemplary embodiment of the present invention.

FIG. 11 is a graph showing the simulation result of the color coordinate variation as a function of the viewing angle of the comparison example and the display panel 403 according to an exemplary embodiment of the present invention.

Referring to FIG. 11, the variations of the color coordinates on the CIE coordinate system (Auv) are calculated while changing the viewing angle from about zero (0) degrees to about 70 degrees. When the viewing angle is about 70 degrees, the variations of the color coordinates of the display panel 406 in the comparison example are about 0.0282, while the variations of the color coordinates of the display panel 406 to which the light extraction layer 460 is applied are about 0.0146. When the light extraction layer 460 is applied to the display panel 406, the variations of the color coordinates are reduced by about 50% compared to that of the comparison example.

FIGS. 12A to 12E are cross-sectional views showing a method of manufacturing a display panel according to an exemplary embodiment of the present invention. In FIGS. 12A to 12E, the same reference numerals denote the same elements in FIGS. 1 to 5, and thus, detailed descriptions of the same elements will be omitted. FIGS. 12A to 12E show the method of manufacturing the display panel 400 shown in FIG. 5.

Referring to FIGS. 12A to 12E, the method of manufacturing the display panel includes forming the lower substrate 410, providing the polymer network liquid crystal, forming the light extraction layer 430, and forming the upper substrate 420.

Figure 12A:
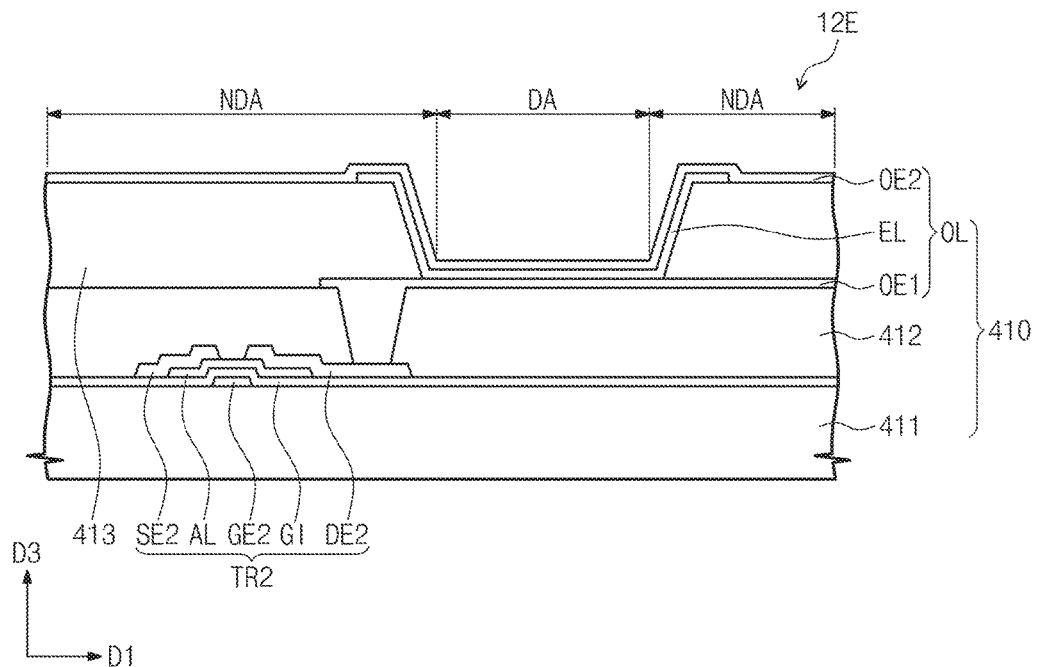
FIGS. 12A, 12B, 12C, 12D, and 12E are cross-sectional views illustrating a method of manufacturing a display panel according to an exemplary embodiment of the present invention.

FIG. 12A shows the forming of the lower substrate 410. The second gate electrode GE2 is formed on the lower substrate 410, and the gate insulating layer GI is formed on the lower substrate 410 to cover the second gate electrode GE2. The semiconductor layer AL is formed on the gate insulating layer GI. The second source electrode SE2 and the second drain electrode DE2 are formed on the semiconductor layer AL and spaced apart from each other.

The insulating layer 412 is formed on the lower substrate 410. The insulating layer 412 covers the second transistor TR2. The display area DA and the non-display area NDA are defined in the lower substrate 410. The insulating layer 412 is partially etched to form the contact hole in the non-display area NDA, through which the portion of the second drain electrode DE2 is exposed.

The first electrode OE1 is formed in the contact hole and the display area DA. The pixel definition layer 413 is formed on the insulating layer 412 and the first electrode OE1. The pixel definition layer 413 is disposed to correspond to the non-display area NDA. The pixel definition layer 413 has the opening corresponding to the display area DA to expose the first electrode OE1 through the opening.

The light emitting layer EL is formed on the first electrode OE1 and the pixel definition layer 413 adjacent to the first electrode OE1. The second electrode OE2 is formed over the lower substrate 410. The second electrode OE2 covers the pixel definition layer 413 and the light emitting layer 413.

Figure 12B:
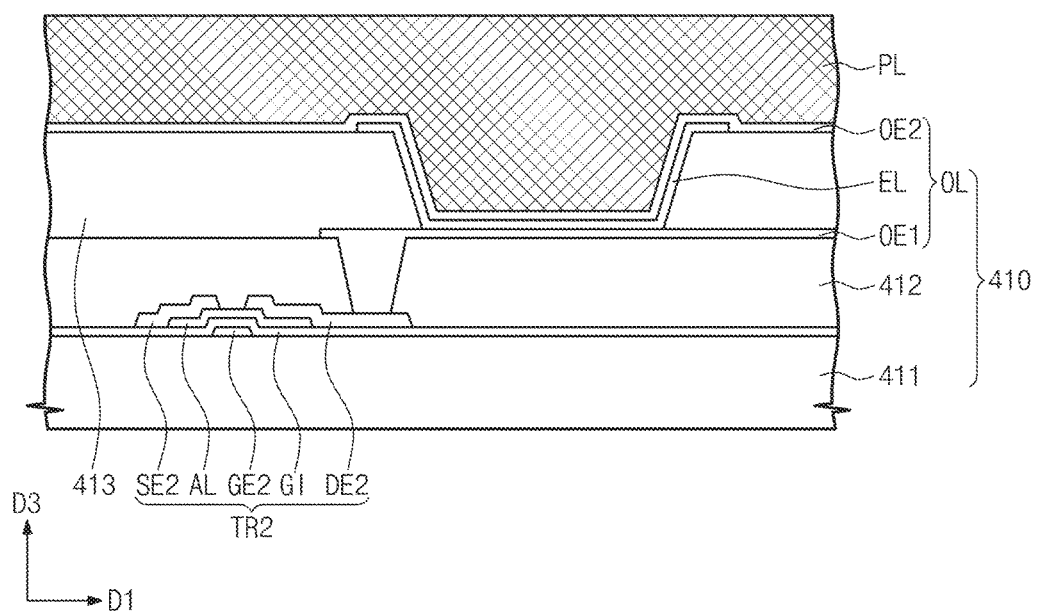

FIG. 12B shows the providing of the polymer network liquid crystal.

The polymer network liquid crystal PNLC (refer to FIG. 4) is disposed on the second electrode OE2 to form the polymer network liquid crystal layer PL. The polymer network liquid crystal PNLC may be provided using a liquid crystal injection method or a liquid crystal dropping method.

Figure 12C:
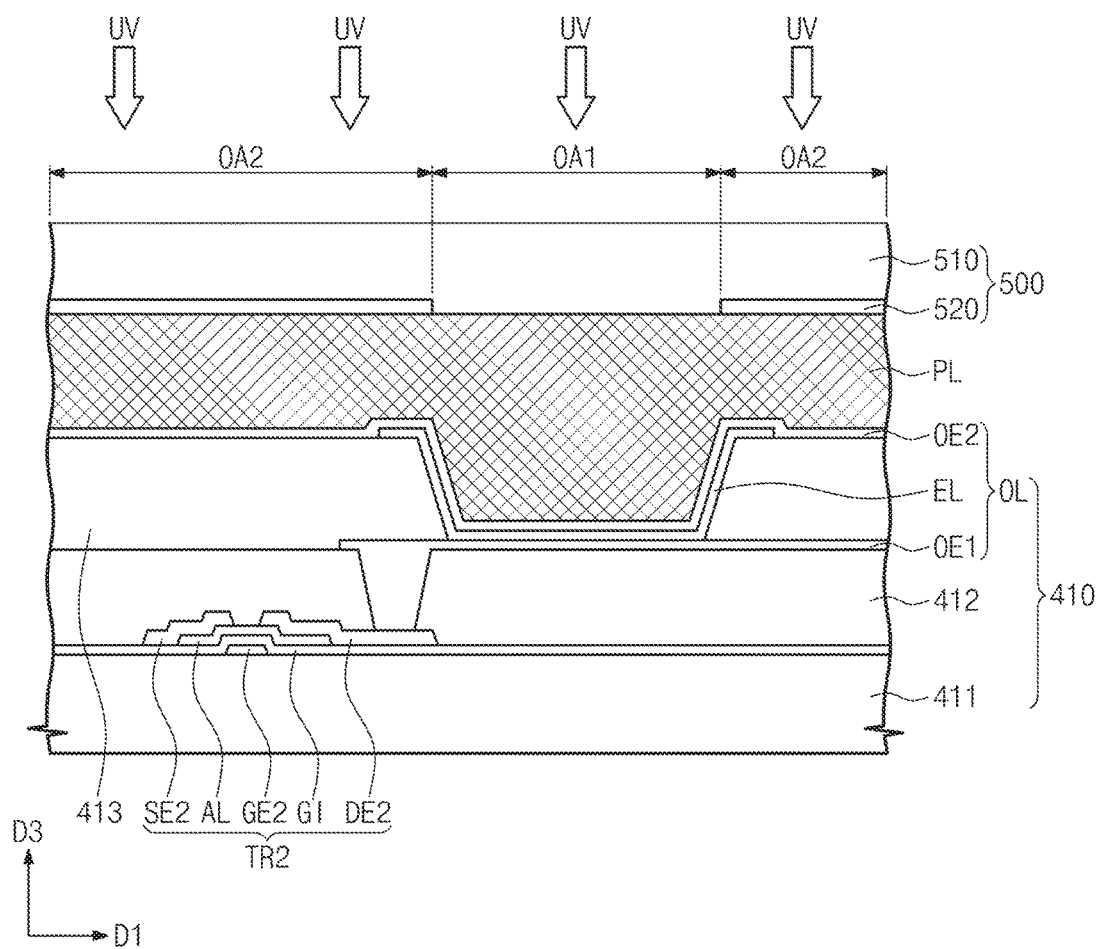
Figure 12D:
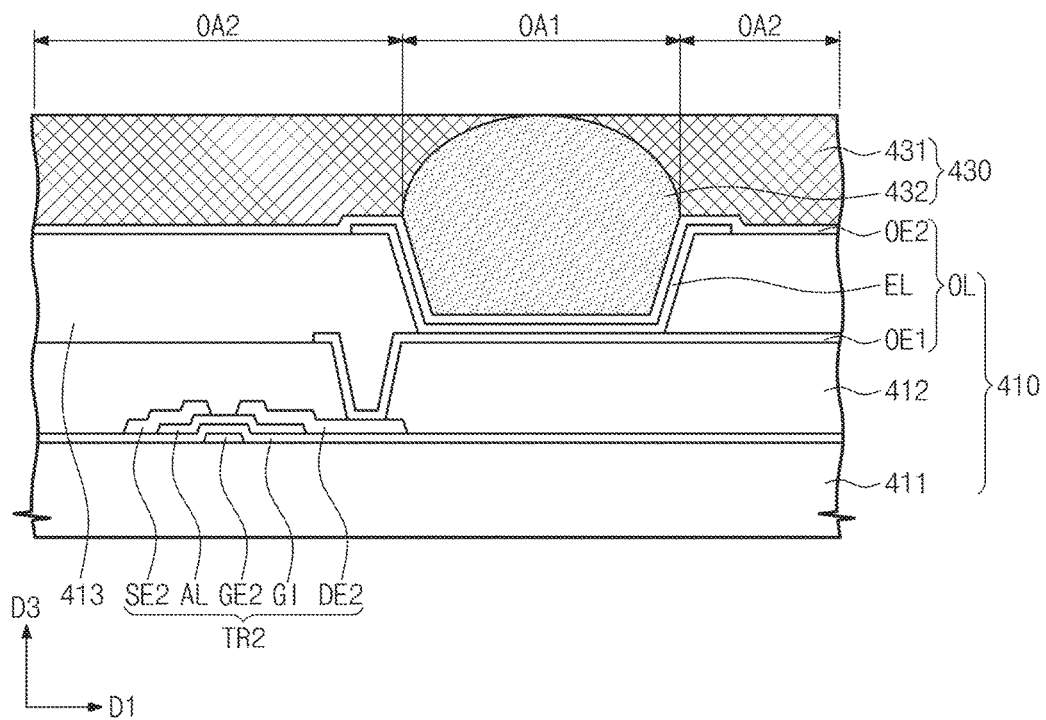

FIGS. 12C and 12D show the forming of the light extraction layer 430.

An exposure mask 500 is disposed on the polymer network liquid crystal layer PL. The exposure mask 500 includes a mask substrate 510 and a light blocking portion 520. The mask substrate 510 is formed of a transparent material, e.g., glass.

The first and second areas OA1 and OA2 are defined in the polymer network liquid crystal layer PL. The light blocking portion 520 is formed on the mask substrate 510 to correspond to the second area OA2. The light blocking layer 520 is formed of a light blocking material.

The exposure mask 500 is aligned on the polymer network liquid crystal layer PL. When ultraviolet radiation UV is radiated onto the exposure mask 500, the portion of the ultraviolet radiation UV which travels to the second area OA2 is blocked by the light blocking portion 520. The other portion of the ultraviolet radiation UV, which travels to the first area OA1, is incident to the polymer network liquid crystal layer PL after passing through the exposure mask

500. The polymers PM (refer to FIG. 5) are cross-linked to each other in the first area OA1 by the ultraviolet radiation UV incident to the polymer network liquid crystal layer PL. Accordingly, the polymer network liquid crystal PNLC in the first area OA1 becomes the sheared polymer network liquid crystal S-PNLC (refer to FIG. 5)

The degree of the cross-link of the polymers PM of the polymer network liquid crystal PNLC is determined depending on the intensity of the ultraviolet radiation UV radiated onto the polymer network liquid crystal PNLC.

The intensity of the ultraviolet radiation UV radiated to the first area OA1 is not constant. In more detail, the intensity of the ultraviolet radiation UV decreases as a distance from the center portion of the first area OA1 increases. Therefore, the degree of the cross-link of the polymer network liquid crystal PNLC in the center portion of the first area OA1 is greater than that of the polymer network liquid crystal PNLC in the end portion of the first area OA1 according to the intensity of the ultraviolet radiation UV radiated to the first area OA1. Thus, the distribution of the cross-link of the polymers PM in the polymer network liquid crystal layer PL of the first area OA1 corresponds to the convex lens structure.

The exposure mask 500 is removed from the polymer network liquid crystal layer PL and the lower substrate 410.

When the forming of the light extraction layer 430 is carried out, the second optical layer 432 having the convex lens structure and including the sheared polymer network liquid crystal S-PNLC is formed in the first area OA1, as shown in FIG. 12D. The first optical layer 431 including the polymer network liquid crystal PNLC is also formed to surround the second optical layer 432.

Figure 12E:
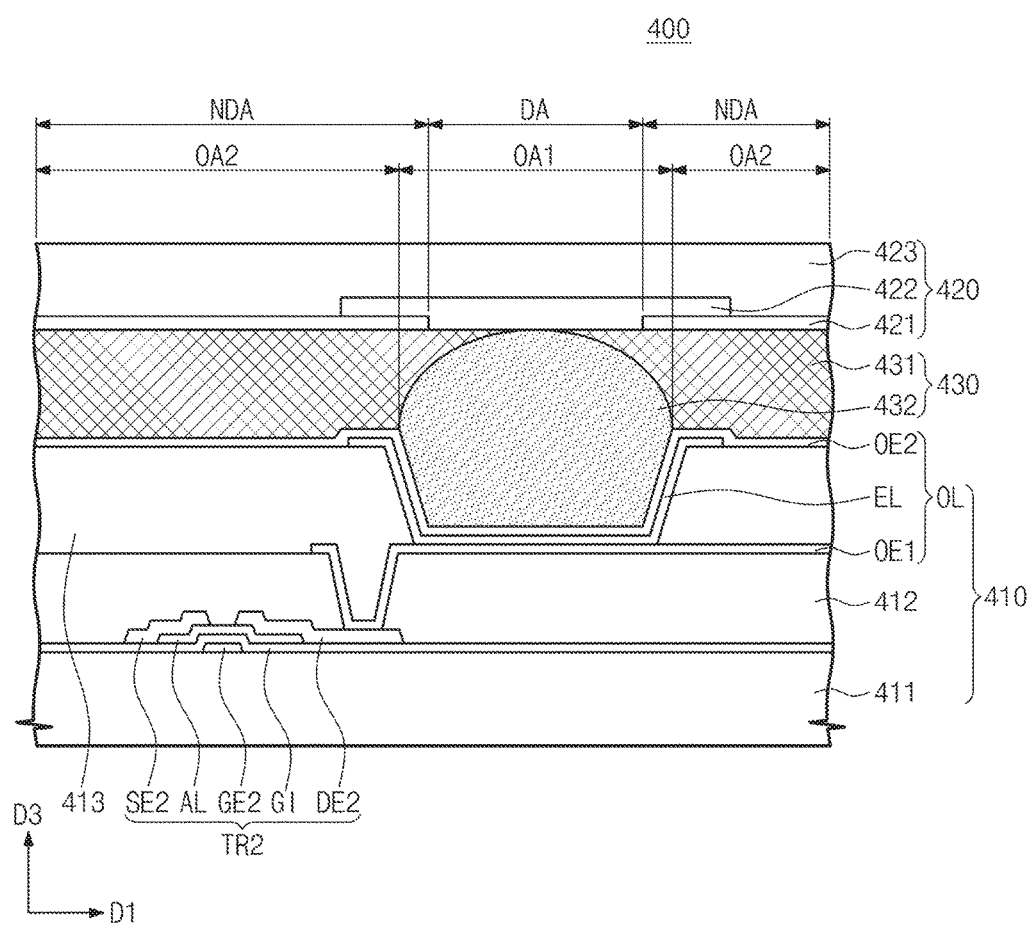

FIG. 12E shows the forming of the upper substrate 420.

The color filter 422 is formed on the upper substrate 420 to correspond to the display area DA. The black matrix 421 is formed on the upper substrate to correspond to the non-display area NDA. The upper substrate 420 faces the lower substrate 410 while being coupled to the lower substrate 410 such that the light extraction layer 430 is disposed between the lower substrate 410 and the upper substrate 420.

Figure 13A:
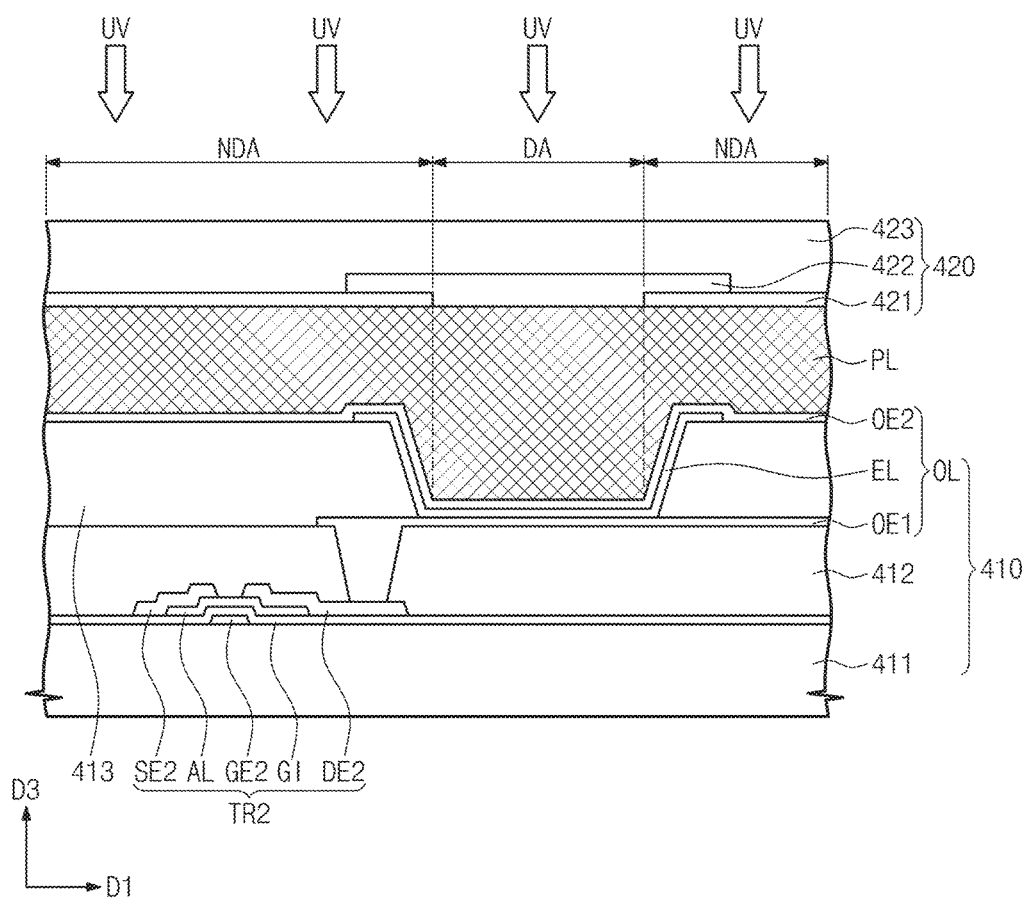
FIGS. 13A and 13B are cross-sectional views illustrating a method of manufacturing a display panel according to another exemplary embodiment of the present invention.
Figure 13B:
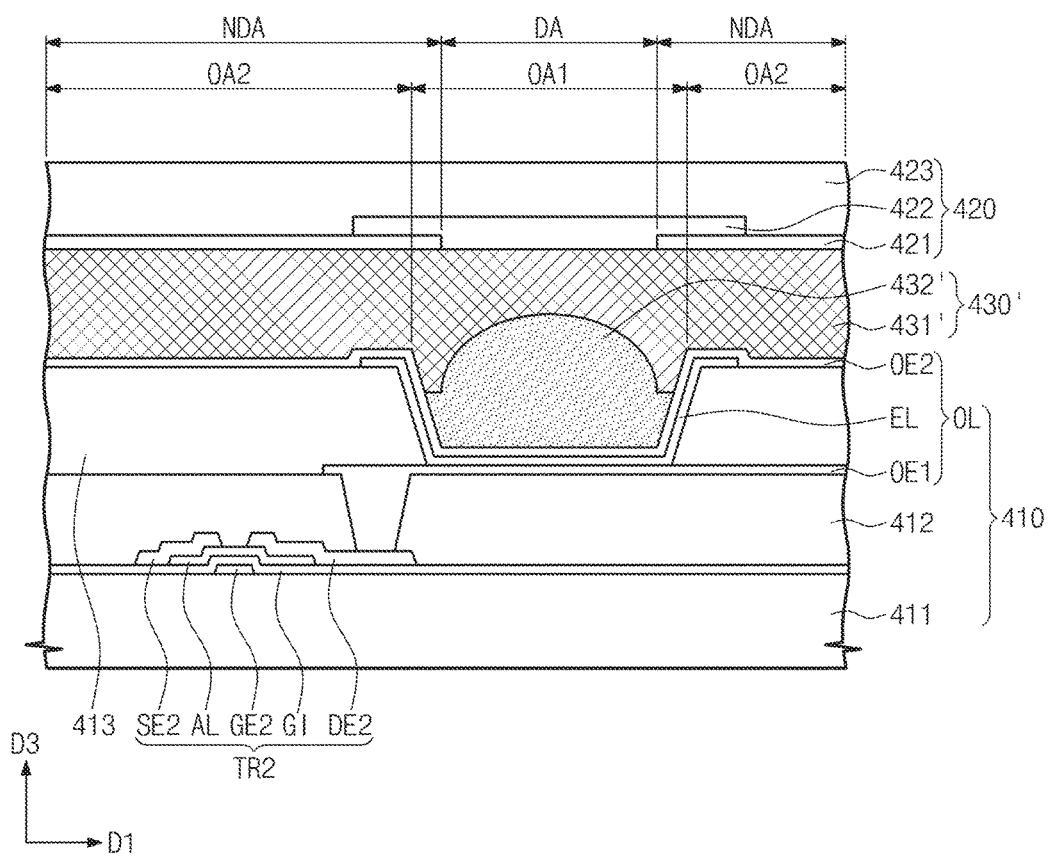

FIGS. 13A and 13B are cross-sectional views showing a method of manufacturing a display panel according to another exemplary embodiment of the present invention. In FIGS. 13A and 13B, the same reference numerals denote the same elements in FIGS. 12A to 12E, and thus, detailed descriptions of the same elements will be omitted.

In the present exemplary embodiment, the method of manufacturing the display panel includes forming the lower substrate 410, providing the polymer network liquid crystal PL, forming the upper substrate 420, and forming a light extraction layer 430'. The method of manufacturing the display panel is the same as the method of manufacturing the display panel described with reference to FIGS. 12A to 12E, except for the forming of the upper substrate 420 and the light extraction layer 430'.

FIGS. 13A and 13B show the forming of the upper substrate 420 and the light extraction layer 430'.

Referring to FIGS. 13A and 13B, the color filter 422 is formed on the upper substrate 420 to correspond to the display area DA and the black matrix 421 is formed to correspond to the non-display area NDA. The upper substrate 420 faces the lower substrate 410 and is coupled to the lower substrate 410 such that the light extraction layer 430' is disposed between the lower substrate 410 and the upper substrate 420.

When the ultraviolet radiation UV is radiated onto the upper substrate 420, a portion of the ultraviolet radiation UV, which travels to the non-display area NDA, is blocked by the black matrix 421. The other portion of the ultraviolet radiation UV, which travels to the display area DA, is incident to the polymer network liquid crystal layer PL after passing through the upper substrate 420. The polymers PM (refer to FIG. 5) of the polymer network liquid crystal layer PL are cross-linked to each other in the display area DA by the ultraviolet radiation UV incident to the polymer network liquid crystal layer PL. Accordingly, the polymer network liquid crystal PNLC in the display area DA becomes the sheared polymer network liquid crystal S-PNLC (refer to FIG. 5). As described with reference to FIG. 12C, the polymer network liquid crystal layer PL may be exposed to the ultraviolet radiation UV to allow the distribution of the cross-link of the polymers PM to correspond to the convex lens structure.

When the forming of the light extraction layer 430' is carried out, the second optical layer 432' having the convex lens structure and including the sheared polymer network liquid crystal S-PNLC is formed in the display area DA, and also the first optical layer 431' including the polymer network liquid crystal PNLC is formed to surround the second optical layer 432'.

As described above, the black matrix 421 blocks the ultraviolet ray UV as the exposure mask 500 (refer to FIG. 12C). Thus, the light extraction layer 430' may be formed without using the exposure mask 500.

Figure 14A:
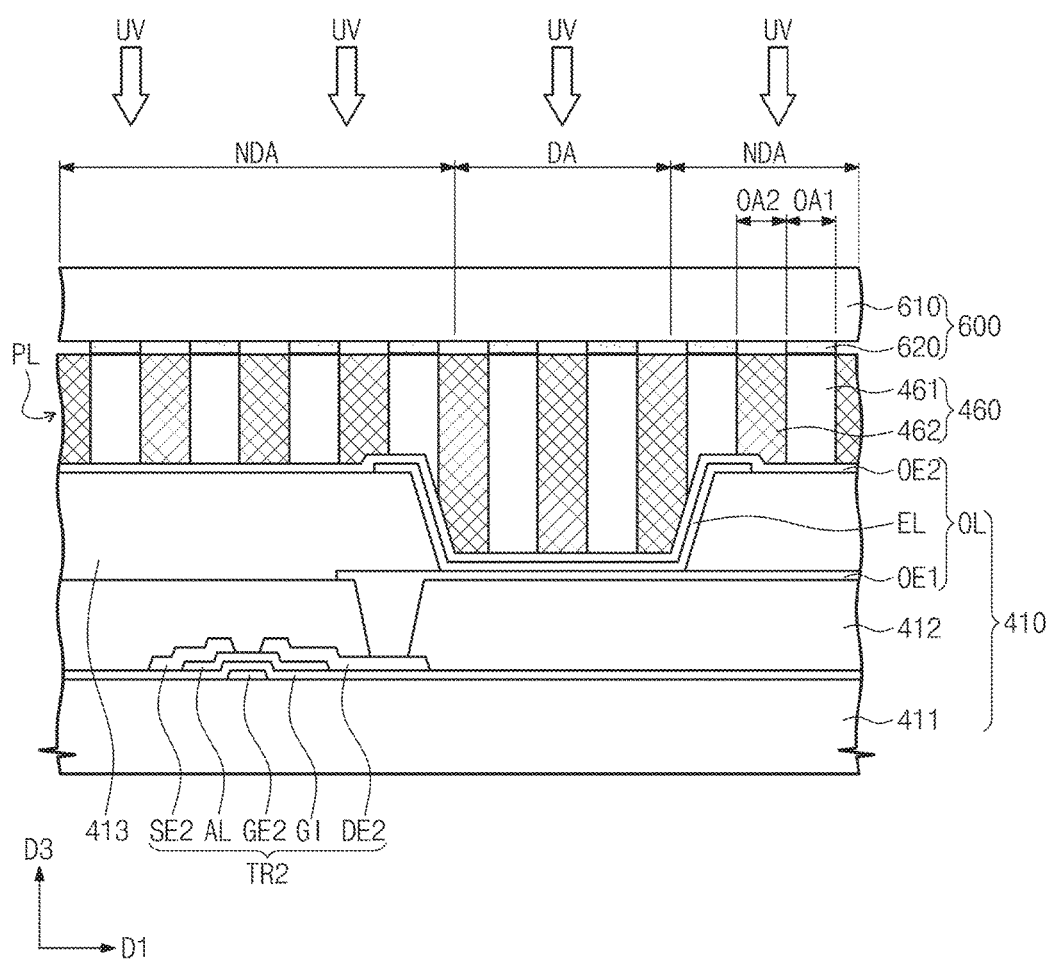
FIGS. 14A, 14B, and 14C are cross-sectional views illustrating portions of a method of manufacturing a display panel according to another exemplary embodiment of the present invention.
Figure 14B:
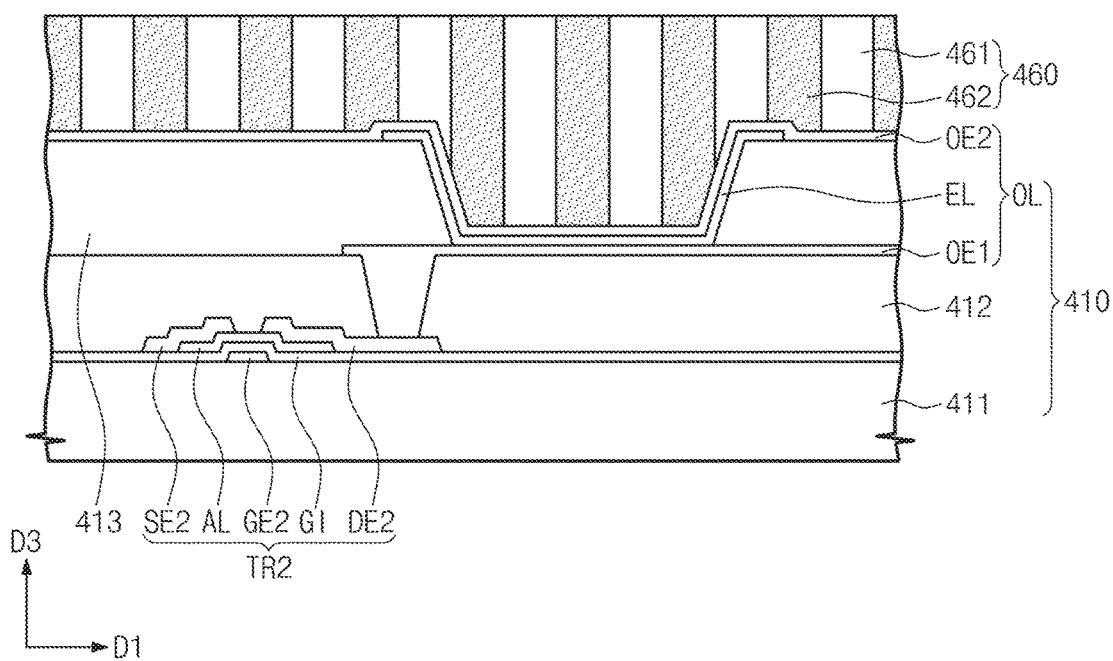
Figure 14C:
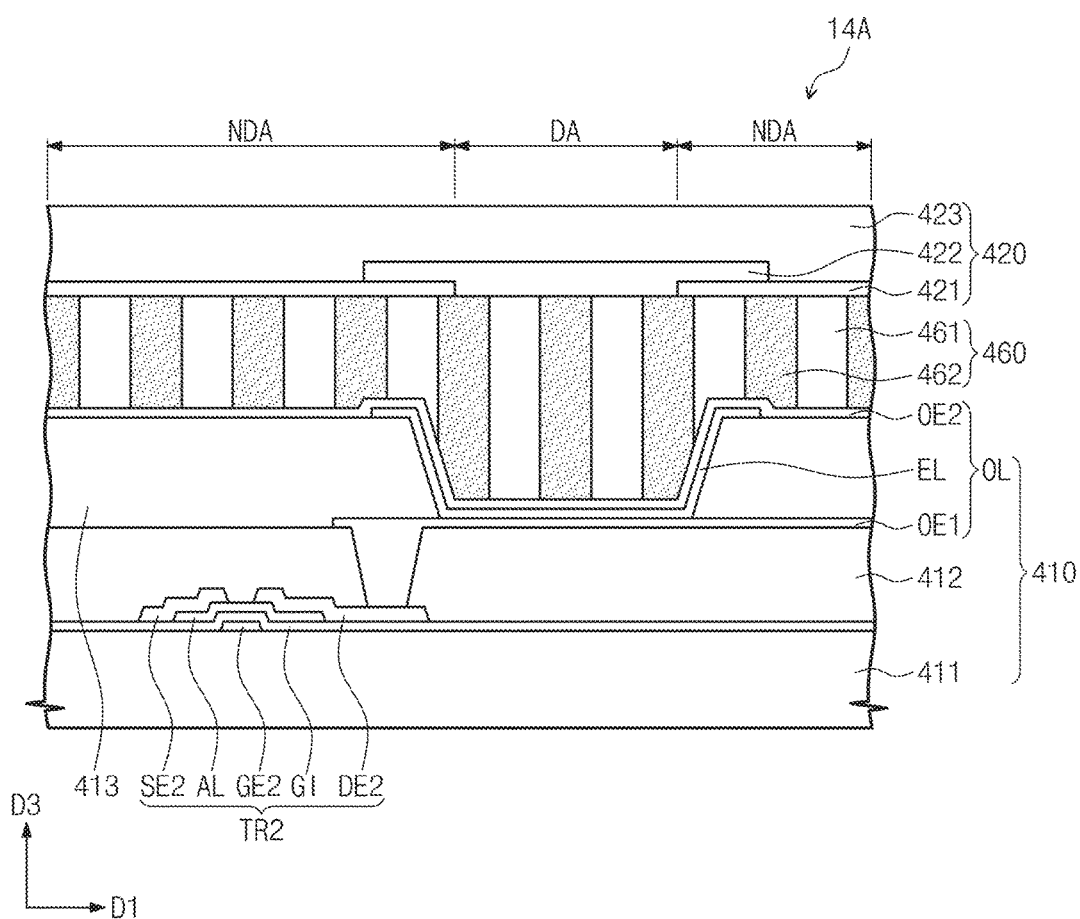

FIGS. 14A to 14C are cross-sectional views showing portions of a method of manufacturing a display panel according to another exemplary embodiment of the present disclosure. In FIGS. 14A to 14C, the same reference numerals denote the same elements in FIGS. 12A to 12E, and thus detailed descriptions of the same elements will be omitted.

The method of manufacturing the display panel includes forming the lower substrate 410, providing the polymer network liquid crystal layer PL, forming a light extraction layer 460, and forming the upper substrate 420. The method of manufacturing the display panel shown in FIGS. 14A to 14C is the same as the method of manufacturing the display panel shown in FIGS. 12A to 12E, except for the forming of the light extraction layer 460 and the upper substrate 420.

An alignment substrate 600 is formed on the polymer network liquid crystal layer PL. The alignment substrate 600 includes a transparent substrate 610 and the alignment electrode 620. The transparent substrate 610 includes the transparent material, e.g., glass.

The first and second areas OA1 and OA2 are defined in the polymer network liquid crystal PL. The first and second areas OA1 and OA2 are alternately arranged with each other in the first direction D1, and a plurality of the first and second areas OA1 and OA2 is provided. In more detail, the first optical layer 460 and the second optical layer 462 are alternately arranged in the display area DA and the non-display area NDA.

The alignment electrode 620 is disposed on the transparent substrate 610 to correspond to the first area OA1. The alignment electrode 620 may be, for example, a transparent electrode, e.g., indium tin oxide, and is aligned on the polymer network liquid crystal layer PL.

A first voltage is applied to the alignment electrode 620, and a second voltage is applied to the opposite electrode, which is disposed to face the alignment electrode 620 while the polymer network liquid crystal layer PL is disposed between the alignment electrode 620 and the opposite electrode. In the present exemplary embodiment, the opposite electrode may be the second electrode OE2. When the first and second voltages are applied to the alignment electrode 620 and the second electrode OE2, respectively, an electric field corresponding to the difference between the first and second voltages is formed in a direction substantially parallel to the third direction D3, while crossing the polymer network liquid crystal layer PL in the first area OA1.

The polymers PM (refer to FIG. 7) and the liquid crystals LM in the first area OA1 are aligned in the third direction D3 in response to the electric field.

When the ultraviolet radiation UV is radiated onto the alignment substrate 600, the ultraviolet radiation UV is incident to the polymer network liquid crystal layer PL after passing through the alignment substrate 600. The polymers PM of the polymer network liquid crystal layers PL in the first area OA1 are cross-linked to each other by the portion of the ultraviolet radiation UV that is incident to the first area OA. Accordingly, the sheared polymer network liquid crystal S-PNLC (refer to FIG. 7) is formed in the first area OA1.

The polymers PM of the polymer network liquid crystal layer PL in the second area OA2 are cross-linked to each other by the ultraviolet radiation UV incident to the second area OA2. Therefore, the aligned polymer network liquid crystal O-PNLC is formed in the second area OA2.

When the forming of the light extraction layer 460 is carried out, the first optical layer 461 including the aligned polymer network liquid crystal O-PNLC is formed in the first area OA1, and the second optical layer 462, including the sheared polymer network liquid crystal S-PNLC, is formed in the second area OA2.

The alignment substrate 600 is then removed from the polymer network liquid crystal layer PL and the lower substrate 410, as shown in FIG. 14B.

The color filter 422 is formed on the upper substrate 420 to correspond to the display area DA and the black matrix 421 is formed to correspond to the non-display area NDA. The upper substrate 420 faces the lower substrate 410, and is coupled to the lower substrate 410 such that the liquid extraction layer 460 is disposed between the lower substrate 410 and the upper substrate 420.

Figure 15A:
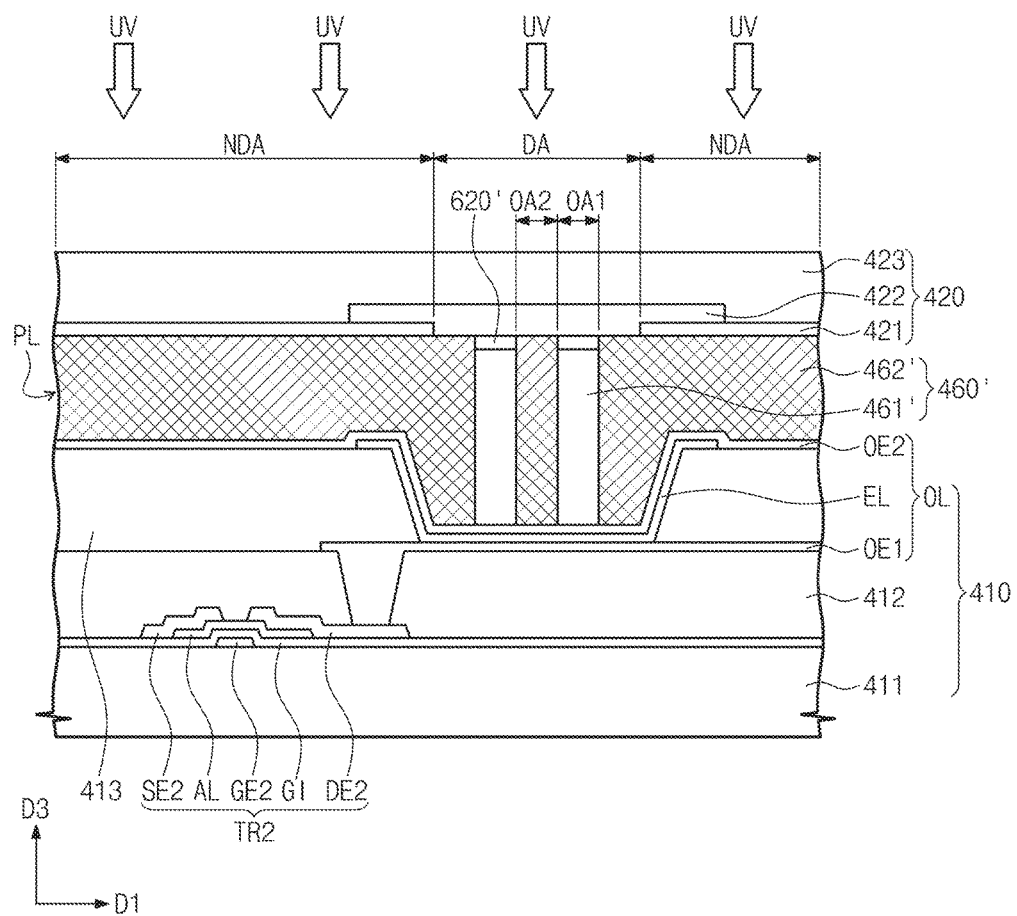
FIGS. 15A and 15B are cross-sectional views illustrating a method of manufacturing a display panel according to another exemplary embodiment of the present invention.
Figure 15B:
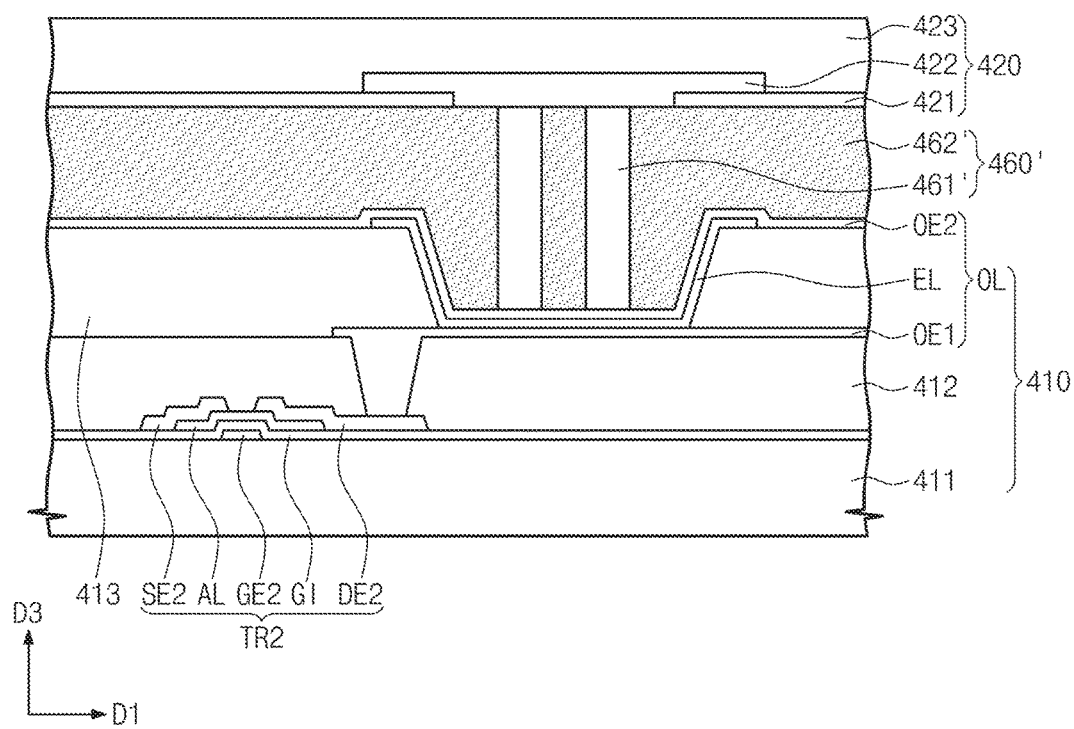

FIGS. 15A and 15B are cross-sectional views showing a method of manufacturing a display panel according to another exemplary embodiment of the present disclosure. In FIGS. 15A and 15B, the same reference numerals denote the same elements in FIGS. 14A to 14C, and thus, detailed descriptions of the same elements will be omitted.

In the present exemplary embodiment, the method of manufacturing the display panel includes forming the lower substrate 410, providing the polymer network liquid crystal layer PL, forming the upper substrate 420, and forming of the light extraction layer 460'. The method of manufacturing the display panel is the same as the method of manufacturing the display panel described with reference to FIGS. 14A to 14C, except for the forming of the upper substrate 420 and the light extraction layer 460'.

The color filter 422 is formed on the upper substrate 420 to correspond to the display area DA, and the black matrix 421 is formed to correspond to the non-display area NDA. The upper substrate 420 faces the lower substrate 410 and is coupled to the lower substrate 410, and the light extraction layer 460' is disposed between the lower substrate 410 and the upper substrate 420.

The first area OA1 and second area OA2 are defined in the display area DA of the polymer network liquid crystal layer PL. The first area OA1 and second area OA2 are alternately arranged in the first direction D1, and a plurality of the first areas OA1 and a plurality of the second areas OA2 are provided.

The alignment electrode 620' is disposed to correspond to the first area OA1.

When the first and second voltages are respectively applied to the alignment electrode 620' and the second electrode OE2, the polymers PM and the liquid crystals LM in the first area OA1 are aligned in the third direction D3 in response to the electric field.

The ultraviolet radiation UV is radiated onto the alignment substrate 600. Accordingly, the polymer network liquid crystal PNLC of the first area OA1 becomes the sheared polymer network liquid crystal S-PNLC, and the polymer network liquid crystal PNLC of the second area OA2 becomes the aligned polymer network liquid crystal O-PNLC.

When the forming of the light extraction layer 460' is carried out, the first optical layer 461', including the aligned polymer network liquid crystal O-PNLC, is formed in the first area OA1, and the second optical layer 462', including the sheared polymer network liquid crystal S-PNLC, is formed in the second area OA2.

Similar to the alignment electrode 620 (refer to FIG. 14A), the alignment electrode 620' aligns the polymers PM (refer to FIG. 7) and the liquid crystals LM (refer to FIG. 7). Therefore, the light extraction layer 460' may be formed without using the alignment substrate 600 (refer to FIG. 14A).

According to the above, the light extraction layer allows light emitted from the organic light emitting device to exit to the outside of the organic light emitting diode display panel through the first and second optical layers, each of which having different optical properties. Therefore, the light transmission efficiency of the organic light emitting diode display panel is increased. In addition, the optical properties of the first and second optical layers are controlled by processing the polymer network liquid crystal. Thus, the light extraction layer may be easily formed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an organic light emitting diode display panel, comprising:
    forming a lower substrate, the lower substrate comprising a first area and a second area;
    forming an organic light emitting device on the lower substrate;
    disposing a polymer network liquid crystal on the organic light emitting device;
    forming a second optical layer in the second area, the second optical layer comprising the polymer network liquid crystal; and
    varying an optical property of the polymer network liquid crystal so as to form a first optical layer in the first area in which the first optical layer has a first refractive index different than a second refractive index of the second optical layer.

2. The method of claim 1, wherein the forming of the first optical layer comprises curing the polymer network liquid crystal of the first area to form a sheared polymer network liquid crystal.

3. The method of claim 2, wherein the curing of the polymer network liquid crystal comprises radiating ultraviolet light to the polymer network liquid crystal of the first area.

4. The method of claim 3, wherein the radiating of the ultraviolet light comprises shadow masking the second area.

5. The method of claim 4, further comprising disposing an upper substrate on the polymer network liquid crystal, the upper substrate comprising a black matrix facing the second area,
wherein the shadow masking of the second area is performed using the black matrix.

6. The method of claim 4, wherein the shadow masking of the second area comprises:
aligning an exposure mask comprising the light blocking material on the polymer network liquid crystal to face the second area;
exposing the polymer network liquid crystal using the exposure mask; and
removing the exposure mask.

7. The method of claim 4, wherein an intensity of the ultraviolet light decreases as a distance from a center portion of the first area increases.

8. The method of claim 1, wherein the forming of the first optical layer comprises forming an aligned polymer network liquid crystal in the first area, the forming of the aligned polymer network liquid crystal comprising:
applying an electric field to the polymer network liquid crystal facing the first area; and
radiating the ultraviolet light onto at least the first area.

9. The method of claim 8, further comprising forming an opposite electrode under the polymer network liquid crystal, wherein the applying of the electric field comprises:
aligning an alignment substrate comprising an alignment electrode opposing the opposite electrode on the polymer network liquid crystal; and
applying voltages to the alignment electrode and the opposite electrode, respectively, to apply the electric field to the polymer network liquid crystal.

10. The method of claim 9, further comprising:
removing the alignment substrate; and
disposing the upper substrate on the first and second optical layers.

11. The method of claim 8, further comprising:
forming an opposite electrode under the polymer network liquid crystal;
forming an upper substrate comprising an alignment electrode facing the opposite electrode; and
disposing the upper substrate on the polymer network liquid crystal,
wherein the applying of the electric field comprises applying voltages to the alignment electrode and the opposite electrode, respectively, to apply the electric field to the polymer network liquid crystal.

* * * * *